United States Patent [19]

Weikel

[11] Patent Number: 4,621,330

[45] Date of Patent: Nov. 4, 1986

[54] PROGRAMMING SYSTEM FOR PROGRAMMABLE TIME REGISTERING ELECTRIC ENERGY METERS

[75] Inventor: Scott J. Weikel, Raleigh, N.C.

[73] Assignee: Westinghouse Electric Corp., Pittsburgh, Pa.

[21] Appl. No.: 584,422

[22] Filed: Feb. 28, 1984

[51] Int. Cl.[4] .................. G01R 11/57; G06F 15/20
[52] U.S. Cl. .................................. 364/483; 364/900; 324/116
[58] Field of Search .............. 364/483, 492, 464, 900; 340/870.02, 825.35, 825.16; 346/14 MR; 324/103 R, 116, 142

[56] References Cited

U.S. PATENT DOCUMENTS

| | | | |
|---|---|---|---|
| 3,413,606 | 11/1968 | Cichanowicz | 340/825.16 |
| 4,093,997 | 6/1978 | Germer | 364/900 |
| 4,166,975 | 9/1979 | Germer et al. | 324/116 |
| 4,283,772 | 8/1981 | Johnston | 364/900 |
| 4,291,375 | 9/1981 | Wolf | 364/483 |
| 4,298,839 | 11/1981 | Johnston | 324/157 |
| 4,441,164 | 4/1984 | Pavan et al. | 364/900 |
| 4,511,979 | 4/1985 | Amirante | 364/483 X |

Primary Examiner—Gary Chin
Attorney, Agent, or Firm—William D. Lanyi

[57] ABSTRACT

A system for programming a time-of-use meter register includes a portable programmer removably coupled to the register, a computer for compiling time-of-use rate schedules, and a computer interface device for removably connecting the computer and the portable programmer. An operator commands the computer to transmit a plurality of rate schedules from the computer over the computer interface device to the portable programmer where they are stored in RAM memory. Field personnel then optically couple the programmer to the register, and initiate a transfer of the rate schedule from programmer RAM to the register.

18 Claims, 15 Drawing Figures

PROGRAMMING SYSTEM FOR PROGRAMMABLE TIME REGISTERING ELECTRIC ENERGY METERS

BACKGROUND OF THE INVENTION

1. Field of the Invention

The invention relates to apparatus for metering of electric energy on a time-of-use basis and, more particularly, to improved apparatus for programming electric energy meters.

2. Description of the Prior Art

Electric utilities must provide sufficient generating capacity to meet peak energy requirements present during periods of highest demand. Thus, a large disparity in load between peak and off-peak periods results in expensive generating capacity remaining idle for a portion of the time. The more a utility can smooth its total customer demand over time, the more efficiently can generating resources be utilized. An increasingly popular method for smoothing load is to be set the cost of electric energy at a higher rate during periods of peak energy demand and at a lower rate during off-peak periods, thereby providing an incentive for customers to shift their usage from peak periods to off-peak periods.

To generate a customer's monthly bill using this system, it is necessary to measure the amount of electricity consumed at a plurality of billing rates, with different rates being in effect at different times depending upon whether the time of consumption is a peak-load period, a non-peak load period, a weekend, holiday, etc. This type of system is known as time-of-use metering. Time registering programmable AC electric energy meters suitable for time-of-use applications require replaceable and alterable meter control data so that the meter may be programmed for various measurement or billing rate schedules on a time and date basis. Apparatus for programming such meters is disclosed in U.S. Pat. No. 4,291,375.

As more experience is gained with time-of-use metering, more and more sophisticated and complex rate schedules are being implemented. Utilities are also requiring more data to be accumulated by a customer's meter. Examples of these increased requirements are the time and date of maximum demand for energy during each rate period; the value, time, and date of the highest demand; and the ability to automatically store all rate period billing data at the end of the billing period.

The programming of information into a customer's meter presents conflicting requirements. On the one hand, it is desirable that the utilities be able to formulate the rate schedules and advanced data retrieval features in a convenient and easily implemented fashion. On the other hand, the actual device which will be used by field personnel to enter the required data into the customer's meters must be small, portable, and easy to use. Furthermore, it should be capable of programming various types of registers. Apparatus available in the prior art has not been found sufficient to meet these requirements.

SUMMARY OF THE INVENTION

In accordance with the present invention, apparatus is provided for programming time registering meters for measuring the flow of electric energy in different time-related categories. The apparatus includes a fixed computer having an operator interface for interactive entry of data to be programmed into the meter. The computer may also include mass data storage devices for program storage and for storing a plurality of different sets of data to be entered into the meter. The computer further includes an output port for transmission of data to an external device.

The apparatus comprises a lightweight portable programmer for entering data into a time registering electric energy meter. The programmer includes a sequence controller such as a microprocessor, a read-write memory, a data communication port removably connected to the computer for receiving data to be ultimately transmitted to the meter, a bidirectional interface unit for transmitting data between the programmer and the meter, and an operator interface device such as a keyboard and display for permitting field personnel to selectively program the associated time registering meter.

In operation, utility personnel at a central location activate the computer, which then requests the operator to enter data through the keyboard. This data is organized by the computer into formats, such as rate schedules, necessary to provide all operating functions of a plurality of types of time registering meters. Each set of data is then stored by the computer and becomes available for transmission to the portable programmer device.

When it is desired to transfer data to the portable programmer, the input port of the programmer is connected to the output port of the computer. In a preferred embodiment, the programmer and computer are each connected to an interface unit which incorporates an RS-232C interface protocol for communication with the computer, and the protocol of the bidirectional programmer interface unit for communication to the programmer. Personnel at the utility's central location then command the computer to transfer one or more selected data sets previously stored in computer memory to the portable programmer. These data sets are then stored in the read-write memory of the programmer.

The programmer is then disconnected from the computer and carried by field personnel to the location of time registering meters which are desired to be programmed. Field personnel operate the keyboard to cause the programmer to issue prompting messages through the display requesting that the operator enter information including a meter identification number, a data set identifier, watt-hour meter constant, and transformer ratios. The programmer assembles the operator-entered data and stored data into appropriate formats for the meter. The operator then couples the bidirectional interface unit of the programmer with a corresponding interface of the meter and operates a switch on the programmer to initiate a programming operation.

The portable programmer transfers the desired data set from read-write memory in the programmer to read-write memory in the meter. The programmer then automatically verifies the proper receipt and storage by the meter of the data set.

DESCRIPTION OF THE PREFERRED EMBODIMENT

Figure 1:
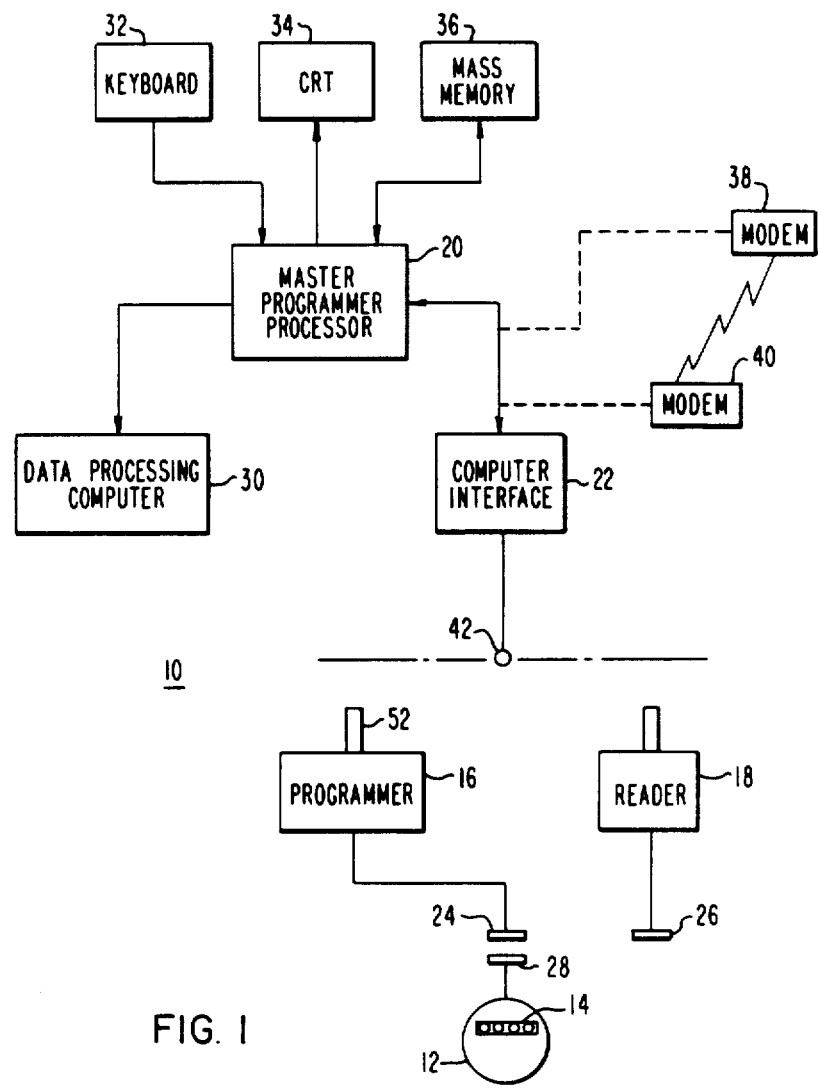
FIG. 1 is a schematic diagram for a time-of-use metering system.

The present invention relates generally to apparatus for metering of electric energy on a time-of-use basis and, more specifically, to an improved apparatus for programming electric energy meters. For purposes of more clearly describing the present invention, the description of the preferred embodiment has been divided into sequential descriptions of the time-of-use system, the programmer description and the computer interface. The disclosure relating to the time-of-use system includes a discussion of its components and its operation. The major components of the time-of-use system include the register, the master processor, the computer interface device and the programmer. The discussion of the programmer description is divided into discussions of the controller and memory, input/output, power and programmer operation. The discussion of the computer interface includes separate descriptions of its schematic and operation. Throughout the description of the preferred embodiment, like components will be referenced with like reference numerals.

I. Time-of-Use System

A. Components

Referring now to FIG. 1, there is shown a time-of-use metering system 10 which incorporates a preferred embodiment of the present invention including a time-of-use electric energy meter 12 having a transducer and an electronic multifunction register 14, lightweight portable devices 16 and 18 for programming and reading, respectively, the register 14, a master programmer processor 20, and a computer interface device 22. As illustrated in FIG. 1, the master programmer processor 20 is cooperatively associated with the keyboard 32, a CRT 34 and a mass memory device 36. The programmer 16 and reader 18 each include an optical interface port, 24 and 26, respectively. The optical interface ports, 24 and 26, may be selectively and removably coupled to a corresponding optical interface port 28, which is part of the electronic register 14 of a customer's meter 12, and communicate with the register 14 using pulses of infrared electromagnetic radiation having a wavelength shorter than 100 micrometers. A more complete description of the optical interface ports 24, 26, and 28 and associated communications protocol may be found in U.S. Pat. No. 4,298,839. The function of the reader 18 may be performed by apparatus described in U.S. Pat. No. 4,291,375. The disclosures of the aforementioned U.S. Pat. Nos. 4,298,839 and 4,291,375 are hereby expressly incorporated by reference. In some systems, a data processing computer 30 may be connected for analyzing data from the meters 12.

1. Register:

An exemplary register 14 is described in U.S. Pat. No. 4,283,772. The disclosure of U.S. Pat. No. 4,283,772 is hereby expressly incorporated by reference. As described therein, the register includes a bidirectional optical interface port, a register controller, and a read-write memory (RAM) for storing time related billing data concerning the customer's consumption of electric energy plus additional information needed to properly compute and store the billing data, hereinafter collectively referred to as meter data.

Although the various models of electronic registers usable with the present invention contain specific data items stored in RAM memory which may differ from those disclosed in the aforementioned U.S. Pat. No. 4,283,772, all such registers include the categories of meter data shown in Table I.

TABLE I

1. Permanent Data
2. Programmable Data
3. Time and Date Data
4. Metered Data
5. Security Data
6. Historical Data
7. Scratchpad Memory The first data category of Table I, permanent data, includes items that are entered when the meter is first placed in service and which will not change, as long as that particular piece of equipment is used to meter a specific customer. Examples of such data include the meter identification number and the number of kilowatt-hours represented by each meter transducer pulse (known as the energy constant, or KH).

Programmable data is information more likely to be changed at various times. The primary example of such data is a time-dependent rate schedule; that is, a list of times and dates at which the cost of electricity to the customer will change and the rate to which it will change (peak, off-peak, etc.) Other examples of programmable data includes information to determine which display quantities will appear on the meter display, and the demand interval length. The time and date data includes seconds, minutes, and hours, as well as day of week, day of year and leap year information.

Metered data includes kilowatt-hours of energy consumed, and may include additional information such as demand data and times of peak usage. This category of data is produced and stored by the meter itself and is read out in order to determine the amount of the customer's bill.

Security data is information produced by the occurrence of an external device, such as a reader or programmer, communicating with the meter. This information is stored in a specific manner in the meter register for readout at subsequent meter reading times to detect unauthorized access to data stored in the register RAM. Such unauthorized access will cause a characteristic pattern to be stored in register RAM, which will be read out and noted when the next authorized meter reading occurs. Security data may also include information stored by the meter register regarding usage of the battery of the register, to enable the utility to detect impending battery exhaustion or possible energy theft by meter substitution.

Historical data is metered data from previous billing periods. It may include cumulative demand data only, or in more sophisticated registers, may constitute a complete copy of the metered data from previous periods. For example, a register may be programmed to copy metered data into the historical data buffer at the end of each billing period, in case a scheduled meter reading by field personnel does not occur at the scheduled time. In this way, metered data for exactly the desired rate period (for example, 30 days) can be recovered. Other types of registers may store a copy of metered data at each season change.

The final category of register RAM data is scratchpad memory. This is information used by the register for various purposes in its normal operations which are only of interest to the register itself. Data in scratchpad memory may also be read out for maintenance purposes.

Transfer of data between a register and either a programmer 16 or a reader 18 is accomplished by transmitting one or more "keywords" or commands to the register. Various types of registers will recognize and respond to various keywords. For example, the register described in the aforementioned U.S. Pat. No. 4,283,772 will recognize and obey the following keywords:

| Keyword Number | Command |
|---|---|
| 1 | Send all data |
| 2 | Receive time data |
| 3 | Receive time data and demand reset data |
| 4 | Receive all data |

Other types of registers may recognize additional or alternative keywords.

2. Master Processor:

The master processor 20 is located at a central utility company location and provides the operator with means for entering bulk data into the system, ultimately to be stored in meter memory, and for retrieving meter readings from a plurality of customer kilowatt-hour meters. The master processor 20 can be cooperatively associated with a fixed data processing computer 30, a keyboard 32 for operator entry of alphanumeric data, and a cathode ray tube (CRT) monitor 34. Other types of data entry and display devices could, of course, be used. The processor 20 also includes a mass memory data storage device 36, such as a cassette type drive. For large system applications, it may be desirable to provide additional mass memory in the form of a floppy disc drive or a hard disk drive. In a preferred embodiment, the processor 20 comprises a model HP-85 computer system manufactured by the Hewlett-Packard Corporation having 32K of internal read-write memory, and data output means consisting of an RS-232C serial interface port. Descriptions of the hardware and operating system software are contained in the following publications available from the Hewlett-Packard Corporation: *Series 80 Personal Computers* by Hewlett-Packard No. 5953-7853, July 1983 or the 1983 *Hewlett-Packard General Catalog*.

3. Computer Interface Device:

Removably connected to the master programmer/processor 20 is a computer interface device 22. The connection between the processor 20 and computer interface device 22 is provided through the serial port and is preferably an asynchronous serial interface constructed according to the RS-232C serial protocol. A compatible asynchronous serial interface configuration is provided at the computer interface device 22. If desired, the connection between the computer interface device 22 and master processor 20 may be made over communication channels using a pair of modems 38 and 40 which communicate over, for example, a voice-grade telephone line. The computer interface device 22 buffers data received from the processor 20 over the RS-232C interface and provides a communication port compatible with the protocol of the optical ports of the programmer 16 (and reader 18) for retransmission of the buffered data to the programmer 16. The computer interface device 22 includes a plug 42 connected to the communication port which may be removably inserted into either the lightweight portable programmer device 16 or the similarly configured lightweight portable reader device 18.

Figure 2:
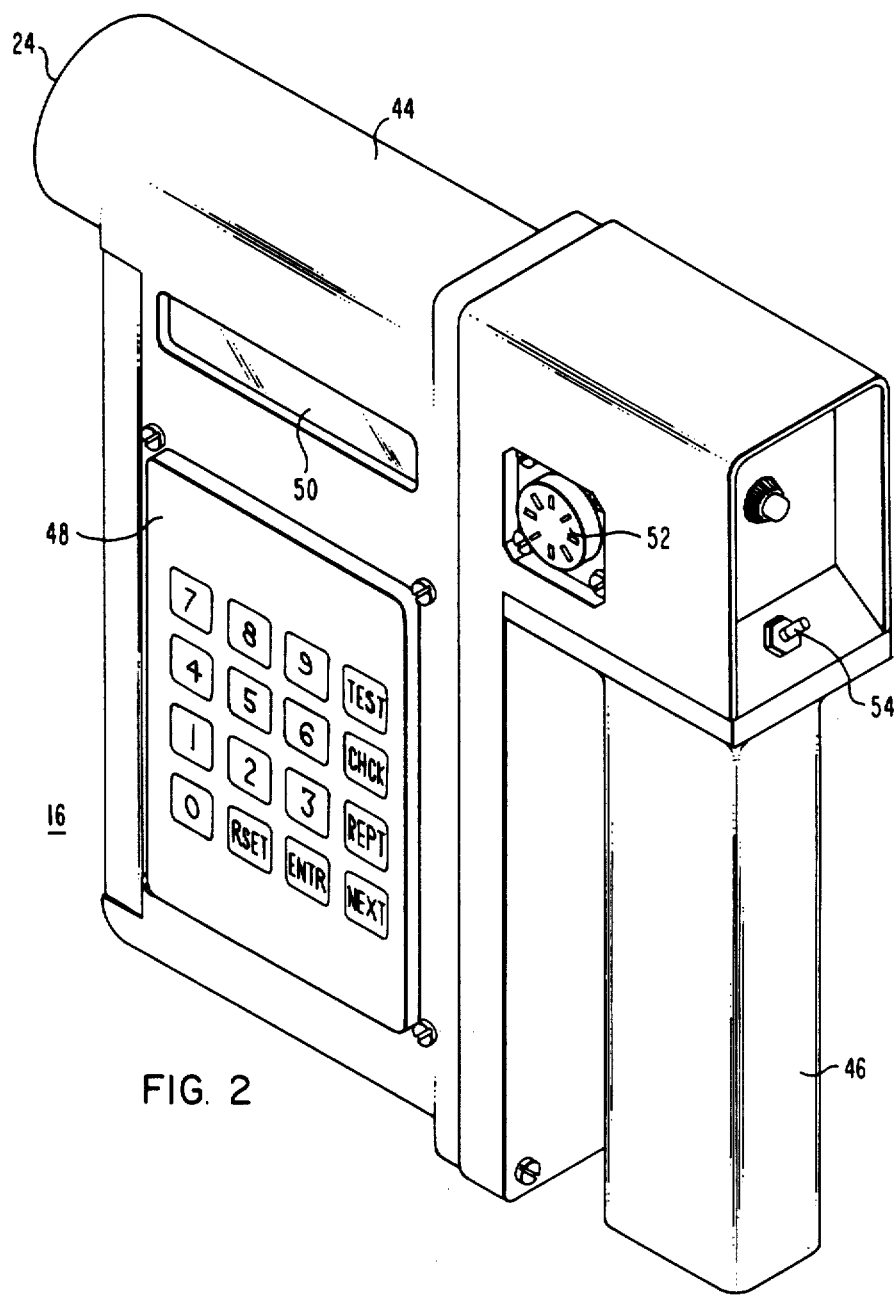
FIG. 2 is a perspective view of the programmer shown in FIG. 1.

4. Programmer:

The portable programmer 16 is shown in FIG. 2, and includes a molded insulating housing 44. The optical interface port 24 is located at one end of the housing, opposite a handle 46. On the side of the housing 44 is located a data entry device consisting of a keypad 48, and a thirty-two position alphanumeric liquid crystal display device 50. The keypad 48 can be one which is similar to Type 88-YY-3616B which is manufactured by Grayhill, Inc. Directly above the handle 46 is a socket 52 for receiving the plug 42 of the computer interface device 22 which is connected to a data communications interface. Directly above the socket 52 is an operator input device consisting of a GO pushbutton switch 54 used to initiate communication with the meter register 14.

B. Operation

Referring now to FIGS. 1 and 2, electric utility personnel located at a central facility energize the master processor 20 and execute a data entry program stored in the mass memory device 36. The program causes the processor 20 to operate in an interactive mode using the keyboard 32 and display device 34 to provide a series of prompts to the operator, requesting the information which will ultimately be stored in meter memory. As each prompt is displayed on the device 34, the operator enters the requested information through the keyboard 32. Requested data includes the following:

(1) rate schedule information including a list of times of load control and switching from one rate to another, the rate to be switched to, and the day type (weekday, weekend, holiday) for which the switch time is valid,
(2) an arbitrary rate ID for the rate schedule,
(3) demand interval,
(4) start and stop dates for daylight savings time,
(5) day of the year for desired holidays,
(6) the type of register for which the rate schedule is intended.

The entered data is then compiled by the processor 20 into meter data sets in predetermined formats for the rate schedules. The formats are images of the data as it will be stored in meter memory. An exemplary format for a data set for one type of register is shown in Table II.

TABLE II

RATE SCHEDULE 256 4-bit words:
Rate Schedule ID # (BCD), Register Type
Relative Start of Date Codes (binary)
Day type, Load Control, Season

| | |
|---|---|
| 00, Rate Code | Switch Point #1 |
| Hour (binary) | (Four 4-bit words) |
| Minute (binary) | |
| | Switch Point #2- |
| | Switch Point #N |
| Least significant Day of Year (BCD) | |
| Tens digit Day of Year (BCD) | Date Code #1 |
| Hundreds digit Day of Year (binary), Day Code | |
| | Date Code #2- |
| | Date Code #N |
| 255 | |

Codes for Table II

| Day Type: | 00 Weekday | Date Code | 00 Holiday |
|---|---|---|---|
| | 01 Saturday | | 01 DST Start |
| | 10 Sunday | | 10 DST Stop |
| | 11 Holiday | | 11 Season Change |
| Load Control: | 0 off | Season: | 00 Winter |
| | 1 on | | 01 Spring |
| | | | 10 Summer |
| | | | 11 Fall |

Figure 13:
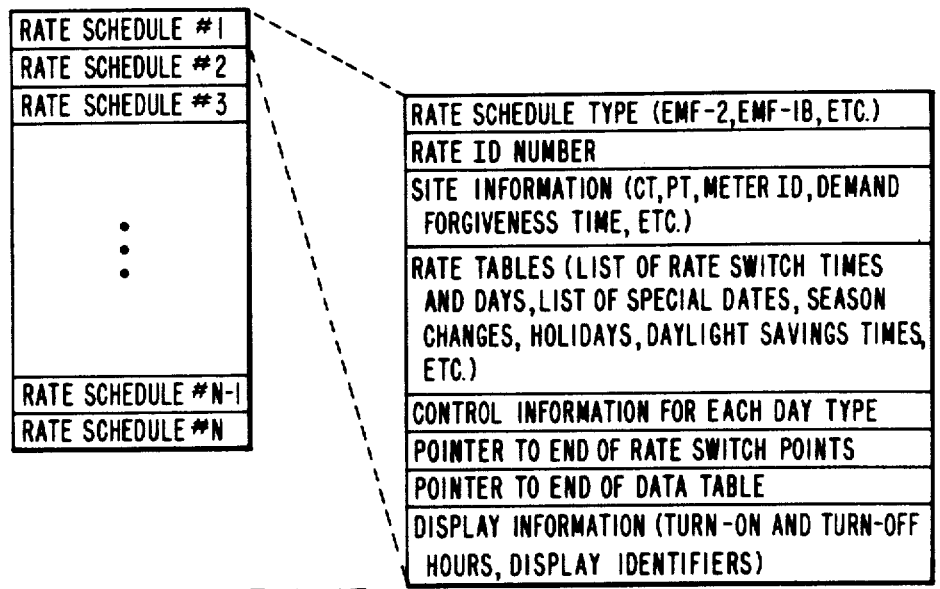
FIG. 13 is a represenative rate schedule file of the present invention.
Figure 14:
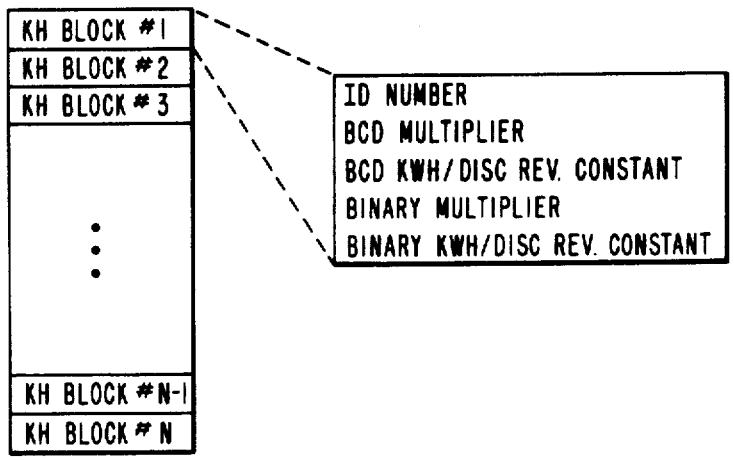
FIG. 14 is a representative energy constant file of the present invention.

Multiple meter data sets of KH data and rate schedules may, of course, be entered by the operator and appropriately indexed for later selection. As each group of KH values and rate schedule is entered by the operator, the processor stores the entered data in files of the master processor 20. A typical rate schedule file is illustrated in FIG. 13 and a typical energy constant file is illustrated in FIG. 14.

When it is desired to transfer the entered data from the master processor 20 to the portable programmer 16, the plug 42 is inserted into a corresponding socket 52 in the programmer 16, and the computer interface device 22 connected to the serial port of the programmer processor 20. The electric utility personnel then activate the processor 20 by entering an appropriate command through the keyboard 32. A data transfer program is called up from mass memory 36 and enters an interactive dialogue with the operator, wherein the processor 20 requests the following information:
1. Date
2. Time
3. Function desired (read, program)
4. Type of device (reader or programmer type)
5. ID number of Rate Schedule to be transferred When all data has been entered to the satisfaction of the operator, the operator supplies a command through the keyboard 32, causing the master processor 20 to transfer data. In a preferred embodiment, up to four sets of programmable data may be transferred and stored by the programmer 16. The processor 20 formats the data into messages. The time block is one message, the KH blocks form one message and each rate schedule is a separate message.

The data passes over the serial interface connection to the computer interface device 22, where it is buffered, checked for errors, and reformulated into the communications protocol compatible with the programmer 16. The data communications interface of the programmer 16 through which it receives data from the master processor 20 is connected in parallel with the optical interface port 24, and thus utilizes the same protocol as is used to communicate between the programmer 16 and register 14. A detailed description of this communications protocol is contained in the aforementioned U.S. Pat. No. 4,298,839. The first message from the computer interface device 22 to the programmer 16 is of fixed length and contains the length of the subsequent message along with the address where the subsequent message is to be stored in RAM in the programmer 16.

Successful transfer of the data from the master processor 20 to the programmer 16 will be indicated on the display device 34 and on a display 50 of the programmer 16, as will be described in greater detail below. At the conclusion of the data transfer, the plug 42 is removed from the programmer 16, and the programmer 16 is carried by utility personnel into the field.

When field personnel arrive at the meter which is desired to be programmed, appropriate entries are made through the keypad 48 on the programmer 16, identifying the meter to be programmed and the selected rate schedule which is desired to be stored in the register. Additional information regarding the site data for the meter 12 is also supplied, as will be explained below in greater detail. The programmer 16 is then placed in physical proximity to the meter 12 such that the interface 24 is optically coupled to the interface 28 of the meter 12. The field operator then presses the GO button 54 on the programmer 16 which causes the programmer 16 to transfer the selected stored programmable data and operator-entered modifiable and programmable data, across the optical interfaces 24 and 28, to memory of the electronic register 14. Successful transfer is indicated by an appropriate message on the display device 50 of the programmer 16.

When it is desired to read the billing data stored by the electronic register 14 of the meter 12, a portable reader 18 is placed in physical proximity to the meter 12 such that the optical interface 26 is optically coupled to the interface 28 of the register 14. The reader 18 is then activated by the operator, initiating a data transfer from the register 14 to read-write memory of the portable reader 18. A detailed description of the data transfer between the register 14 and the reader 18 may be found in U.S. Pat. No. 4,291,375, the disclosure of which is hereby incorporated by reference.

Between fifty and one-hundred fifty meters may be read by the portable reader 18, depending on the type of electronic register 14 which is read. That is, some types of registers may contain larger volumes of information than others. When the memory of the reader 18 is full, an appropriate message is displayed on a display device to the operator. At this point, the operator returns the reader 18 to the computer interface device 22 which is coupled to the master processor 20. The plug 42 is then inserted in the appropriate socket of the reader 18. Commands are then entered through the keyboard 32 of the master processor 20 to initiate a READ operation from the reader 18 to the master processor 20. When all data has been successfully transferred, appropriate messages are displayed on the display device 34 of the master processor 20 and on a display device of the reader 18.

II. Programmer Description

A. Controller and Memory

Figure 3:
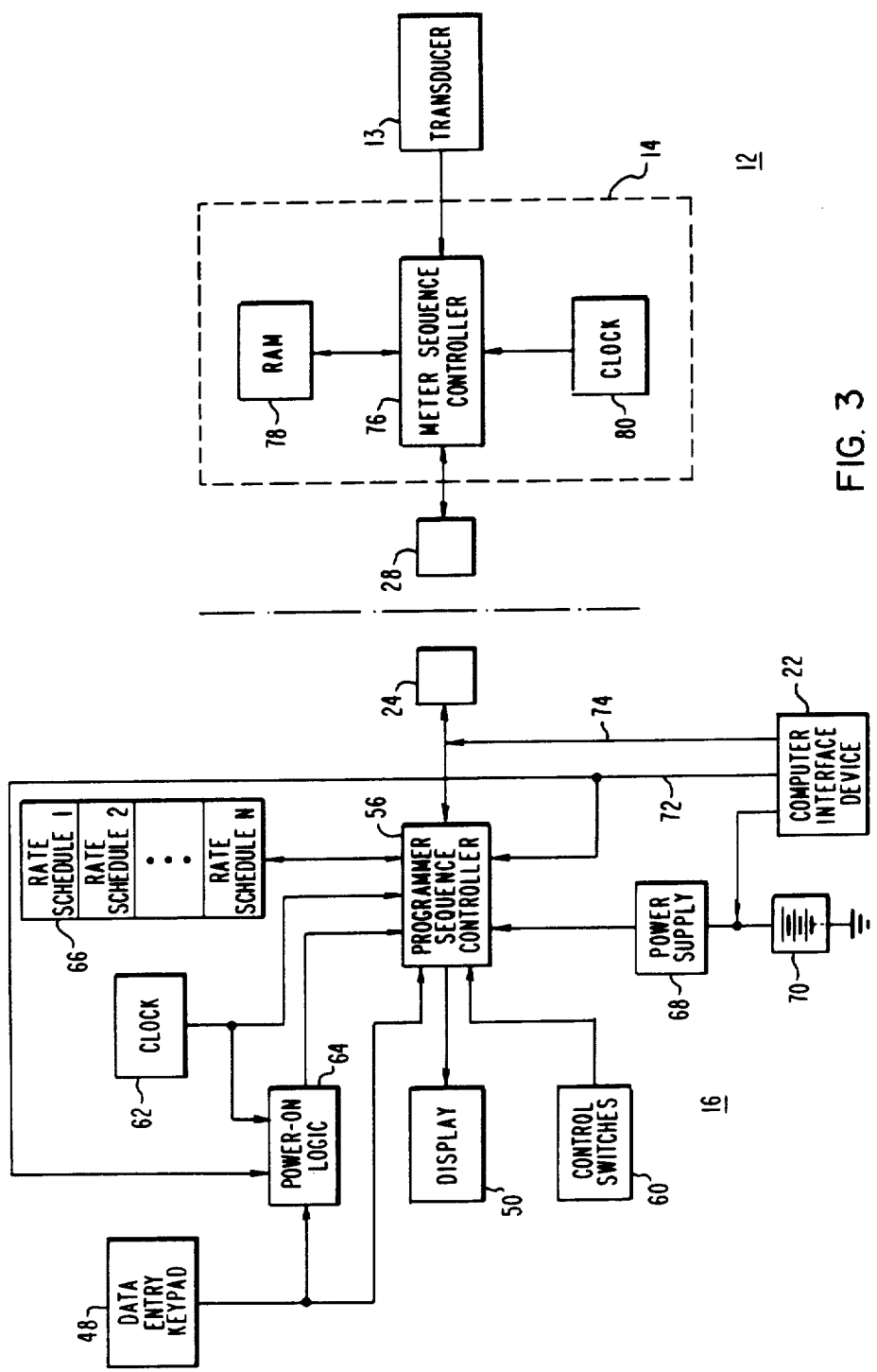
FIG. 3 is a functional block diagram of the programmer shown in FIGS. 1 and 2.

Referring now to FIG. 3, there is shown a schematic diagram of the portable programmer 16 and meter 12. As can be seen, the programmer 16 includes a programmer sequence controller 56 which initiates the various operations of the programmer 16 in response to inputs from a data entry keypad 48, control switches 60, the computer interface device 22, and clock 62. The programmer sequence controller 56 preferably consists of a microcomputer such as a type MK38P70 manufactured by the Mostek Corporation. The controller 56 contains a socket for programmable read only memory (PROM or EPROM) which contains program instructions to enable the controller 56 to perform the operation to be later described.

In order to conserve power, various portions of the programmer 16 are selectively energized only when needed. Accordingly, there is provided a power-on logic circuit 64 which selectively energizes the various portions of the controller when necessary. The inputs to the power-on logic circuit 64 which initiate application of operating power include the data entry keyboard 48, the computer interface device 22, and a clock circuit 62. The clock circuit 62 is also connected as an input to the controller 56. The display device 50 is preferably a liquid crystal alphanumeric display such as an IEE type 3802-03-32.

Also connected to the controller 56 is a read-write memory 66 designated RAM for storing variable data utilized in the operation of the programmer 16, and various categories of data transmitted from the master processor 20 or entered by field personnel using the keypad 48. The data stored in RAM is shown in Table III.

TABLE III

| Programmer RAM |
| --- |
| 1. Present Time and Date (seconds, minutes, hours, day of week, day of year, decade, leap year) |
| 2. Current Season |
| 3. Current State (See Table VI) |
| 4. Display Buffer |
| 5. Last Selected Rate ID |
| 6. Last Selected KH ID |
| 7. Entered Current Transformer Ratio |
| 8. Entered Potential Transformer Ratio |
| 9. Entered Unique Meter ID |
| 10. Register Type for Last Entered Rate Schedule Class |
| 11. Buffer for Keywords |
| 12. Buffer for ID Information Returned by Some Register Types |
| 13. Main Communications Buffer |
| 14. KH ID Blocks |
| 15. Rate ID Blocks |

A power supply 68 supplies operating power for all components of the programmer 16, providing a continuous supply and an intermittent supply, and is energized by a rechargeable battery 70. Removable connections from the computer interface device 22 include a status line 72 which indicates to the controller 56 that the computer interface device 22 is indeed connected, and a data channel 74 is connected to the controller 56 in parallel with the optical port 24 used for communication with the register 14 of the meter 12.

As can be seen in FIG. 3, the meter 12 includes, in simplified form, a transducer 13 which supplies a train of pulses, each of which are representative of the consumption of a predetermined quantum of electrical energy on a circuit being monitored by the meter 12. The transducer 13 provides these pulses to the register 14 which includes a meter sequence controller 76 which preferably comprises a microcomputer. Also connected to the controller 76 is a RAM memory device 78 containing the data shown in Table I, a clock 80, and the optical port 28. A more complete description of the meter 12 may be found in the aforementioned U.S. Pat. No. 4,283,772.

The programmer sequence controller 56 formulates the data which previously had been transferred from the master processor 20 (shown in FIG. 1) and combines it with data entered by field personnel through the keypad 48 to form blocks of data for transmission across the optical ports 24 and 28 to the RAM 78 of the electronic register 14.

The formats for these data blocks are dependent upon the data specifying the register type, which is stored in each rate schedule. Accordingly, selection of rate schedules including different register type data will result in the formulation of different data blocks for transmission to different register types.

Figure 4:
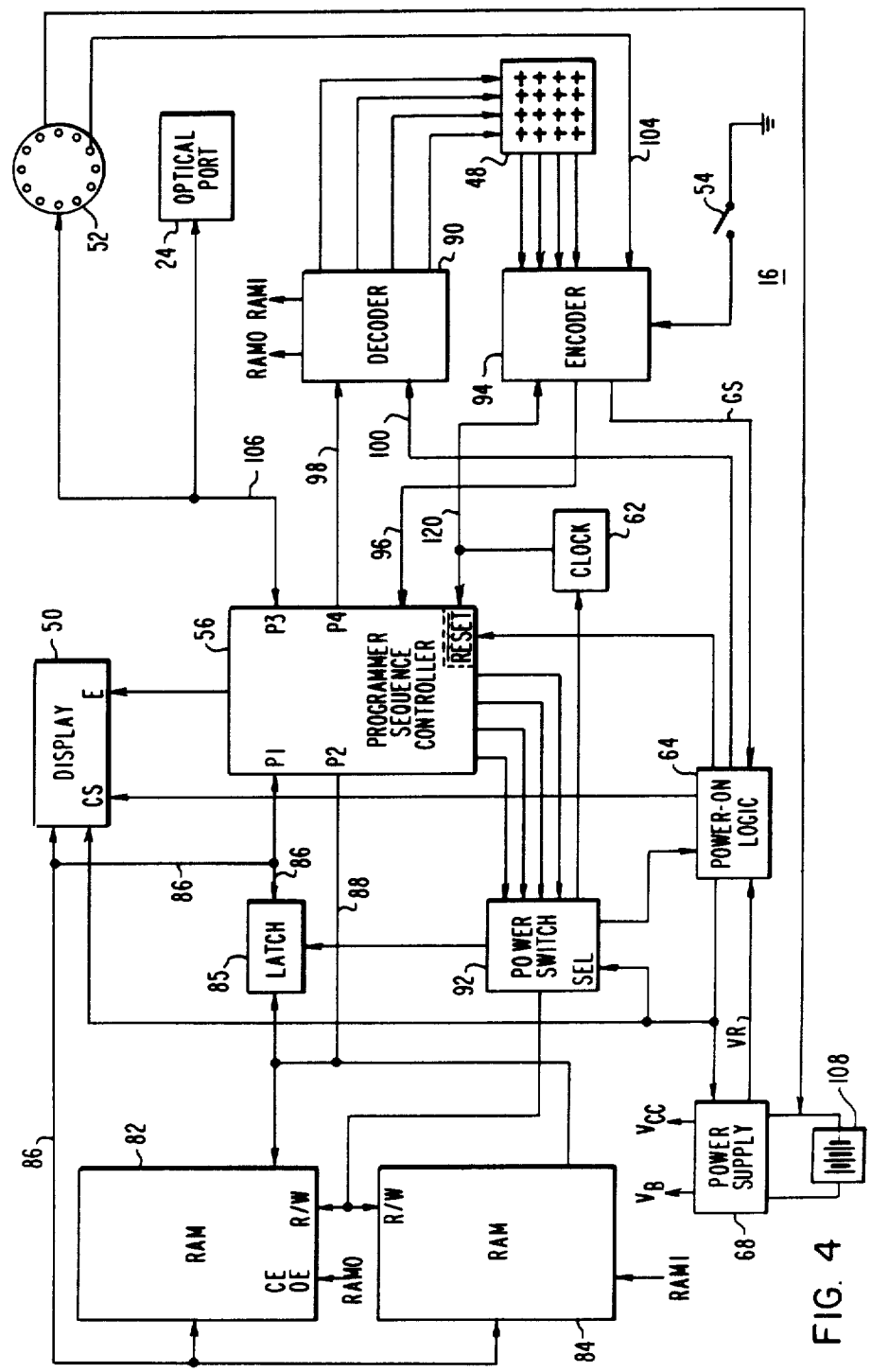
FIG. 4 is a schematic diagram of the programmer shown in FIGS. 1–3.

Referring now to FIG. 4, there is shown a schematic diagram of the programmer 16. Unless otherwise specified, all circuit devices are of the complementary metal-oxide silicon (CMOS) type for the purpose of minimizing power consumption.

The controller 56 comprises a eight-bit microprocessor. In a preferred embodiment, a type MK38P70 device manufactured by the Mostek Corporation provides the functions of the controller 56. The controller is an integrated microcomputer including an on-chip control logic unit, input/output ports, and RAM. The controller 56 also includes a plug-in read only memory (ROM) configured as 4,096 words of 8 bits each. The read only memory may include either programmable read only memory (PROM) or mask-programmed ROM or EPROM and contains program instructions for the controller 56, as will be described hereinafter. A more complete description of the construction and operation of the controller 56 may be obtained in the MOSTEK 1982/83 Microelectronics Data Book available from the Mostek Corporation. In the preferred embodiment, the controller 56 is configured with a single bidirectional eight-line input/output port P1, a single eight-line output port P2, and a pair of ports P3 and P4 configured as mixed input and output, as shown in FIG. 4.

Read-write memory for the programmer 16 is supplied by a pair of CMOS random-access memory (RAM) devices, 82 and 84, each configured as 8,192 words of 8 bits each. Eight address lines of each memory device 82 and 84 are connected in parallel to a latch device 85. The latch device 85 is, in turn, supplied by an eight-bit bus 86 connected to the bidirectional I/O port P1 of the controller 56. Five additional address lines for the RAM devices, 82 and 84, are directly connected over a five-bit bus 88 to output port P2 of the controller 56. The data output of the RAM devices, 82 and 84, are connected in parallel to the eight-bit bus 86 connected to the bidirectional I/O port P1 of the controller 56.

Control of the RAM devices, 82 and 84, includes CHIP ENABLE and OUTPUT ENABLE terminals, and a read/write terminal. The CHIP ENABLE and OUTPUT ENABLE terminals are connected in parallel for the RAM devices, 82 and 84, and are designated in FIG. 4 as RAM 0 and RAM 1, respectively. Activation of the RAM 0 and RAM 1 lines serve to alternately select one of the RAM devices, 82 and 84, as the active memory device. Control of the RAM 0 and RAM 1 lines is accomplished through operation of a decoder 90, as will be described more completely below. The read/write terminal of both RAM devices, 82 and 84, are connected in parallel and are controlled through operation of a power switch device 92, as will be more completely described below.

B. Input/Output

The display device 50 in a preferred embodiment is the type IEE 3802-03-032 thirty-two character liquid crystal display device manufactured by the Industrial Product Division of Industrial Electronics Engineers, Inc. of Van Nuys, CA. Data input to the display device 50 is provided over the eight-bit bus 86 connected to the bidirectional I/O port P1 of the controller 56. As has been previously described, the bus 86 is also connected to the address and data lines of the RAM devices, 82 and 84. The display module has a latch function to capture only the data when it is valid for the display. The module also contains RAM, decoders for character generation, LCD drivers, a controller such as a microprocessor and the display itself.

Control of the display 50 is supplied by an E line from the controller 56 and a CS line from power-on logic 64. The E line (ENABLE) provides a pulse and data is clocked into the display on the trailing edge of that pulse. The CS line (CHIPSELECT) is an active high input. When this input is low, the 8-bit bus is tri-stated. This device must be selected to write to it.

The keypad data entry device 48 includes 16 key switches and 8 terminals, including four row terminals and four column terminals. The four row terminals are connected to four input terminals of a one-of-8 priority encoder device 94. The output of the encoder 94 is connected over a three-bit bus 96 to the I/O port P4 of the controller 56. The encoder 94 also includes an additional output line GS. When any one of 8 input lines to the encoder 94 assumes a logic HI condition, a binary signal appears on the three-bit output bus indicative of which of the eight input lines has been activated. In addition, the encoder 94 energizes an output line GS upon activation of any of the inputs to the encoder device 94. The GS line is used to initiate a power-up condition for that portion of the circuitry which is not continuously energized, as will be more completely described hereinafter.

The four column conductors of the keypad 48 are connected to four of the ten output terminals of a one-of-ten decoder device 90. The decoder 90 also includes three input terminals connected over a three-bit bus 98 to three output terminals of the I/O port P4 of the controller 56. An additional input terminal 100 of the decoder device 90 causes all output terminals thereof to assume a logic HI condition whenever a logic HI signal appears at the terminal 100. With the terminal 100 set LO, a binary input signal from the controller 56 will cause one and only one of the output terminals of the decoder 90 to assume a logic LO condition.

The encoder 94 and decoder 90 include additional connections other than those of the keypad 48. As can be seen in FIG. 4, the decoder device 90 includes two additional output lines RAM 0 and RAM 1, connected to the CHIP ENABLE and OUTPUT ENABLE terminals of the RAM devices, 82 and 84, respectively. When the controller 56 provides a binary output signal of the form 1-0-0 to the input of the decoder 90, the RAM 0 output is pulled LO. This causes the RAM memory device 82 to be activated. Alternatively, a binary output signal of 1-0-1 provided from the controller to the decoder 90 will cause the RAM 1 output to be pulled LO, with all of the other outputs of the decoder 90 (including RAM 0) to remain HI. Thus the RAM device 82 is deactivated and the RAM device 84 is activated. Since access to the RAM memory devices, 82 and 84, is not required at the same time that the keypad is being decoded, these two functions do not interfere with each other.

The encoder device 94 includes three other input lines not previously discussed. One of these lines is connected to the GO switch 54. An input line 104 is also connected to the encoder 94 from a terminal on the socket 52. When the computer interface device 22 is plugged into the programmer 16, the line 104 assumes a logic HI condition, informing the controller 56 of the connection to the computer interface device 22, and causing the controller 56 to execute a program to receive data to be downloaded from the master processor 20, in a manner to be more completely described below. The final connection to the encoder 94 is a clock line 120 which becomes activated once each second by the clock circuit 62, to cause the controller 56 to update the real time clock and calendar. The particular routine which updates the real time clock and calendar will be discussed below in conjunction with FIG. 12 which illustrates its logical flowchart. The clock line 120, the computer interface line 104, the operator switch 54, and the switches of the keypad 48 each generate a binary output signal on the bus 96 which is then interpreted by the controller 56 and used to initiate a predetermined operation.

The optical interface port 24 of the programmer 16 is connected to an I/O port P3 of the controller 56 over a four-bit bus 106 to provide synchronous bidirectional communication with an associated electronic register 14 using DATA IN, STROBE IN, DATA OUT and STROBE OUT signals. A more detailed description of the optical interface port may be found in the aforementioned U.S. Pat. No. 4,298,839.

As can be seen, the bus 106 from the I/O port P3 of the controller 56 connected to the optical interface 24 is also connected in parallel to terminals of the socket 52 which are removably connected to the computer interface device 22. Thus, synchronous communication between the computer interface device 22 and controller 56 is accomplished using the same protocol as communication through the optical interface 24.

C. Power

A 5-volt 0.5 ampere-hour nickel-cadmium battery 108 provides operating power for the device 16 through the power supply 68. The power supply 68 provides a continuous output voltage VB of 5 volts. This voltage is supplied at all times to critical components of the programmer 16. The supply 68 also provides on a continuous basis a reference voltage VR of 2.5 volts for use by the power-on logic circuit.

The power switch circuit 92 operates in conjunction with the power-on logic circuit 64 to lock control signals to various components in predetermined states during power-off conditions. During power-on conditions, the switch circuit 92 allows the the control signals to be operated by the controller 56.

A third voltage $V_{CC}$ is supplied to the controller 56 on an intermittent basis only when necessary, in order to conserve power. The presence of the voltage $V_{CC}$ is determined by the power-on logic circuit 64.

Figure 4A:
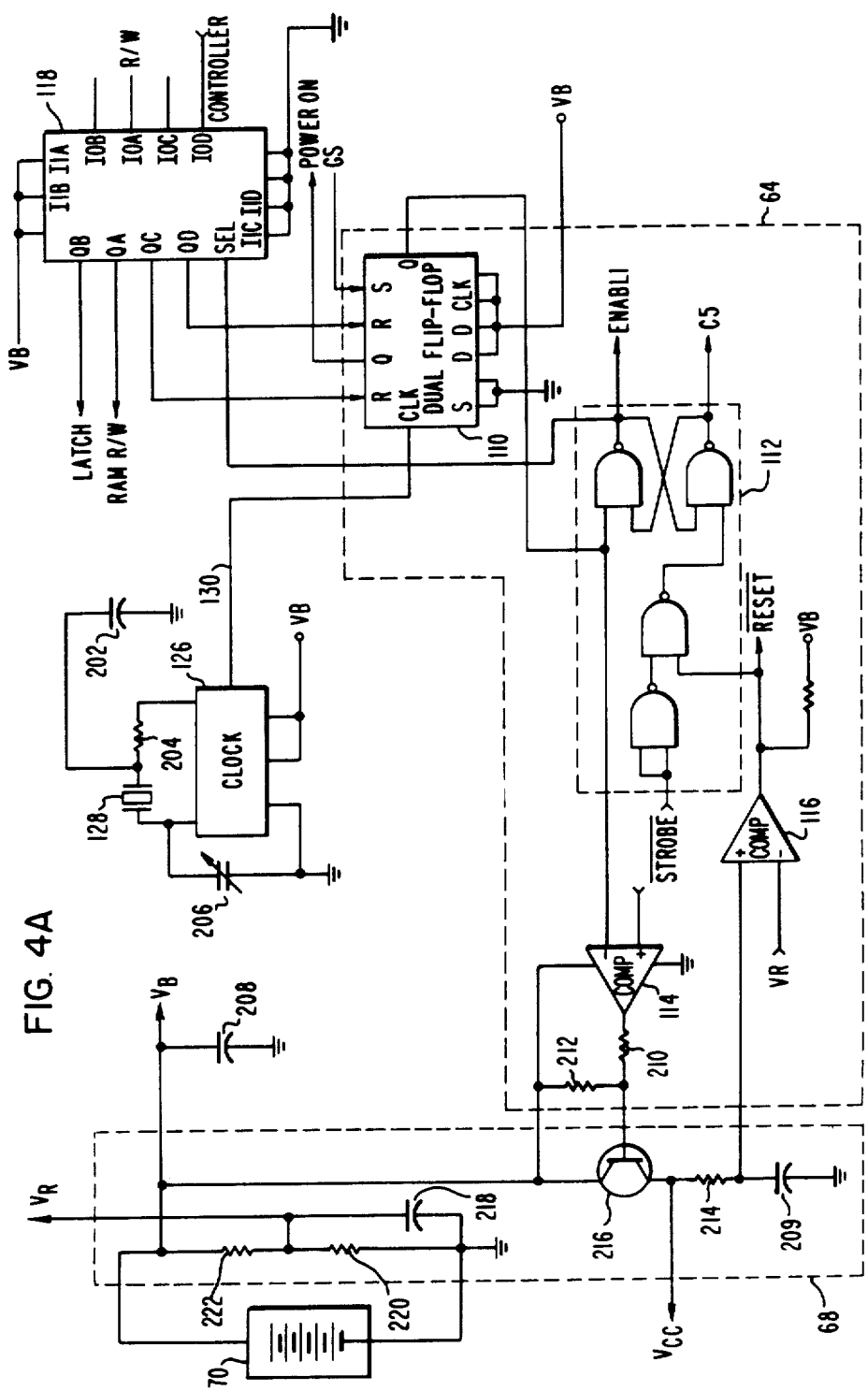
FIG. 4A is a more detailed schematic diagram of the power-on logic and power switch shown in FIG. 4.

The structure of circuits 64 and 92 is shown in greater detail in FIG. 4A. As can be seen therein, the control line GS from the encoder 94 is supplied to a SET input of a dual flip-flop circuit 110. The line GS goes HI whenever any of the inputs of the encoder 94 are energized. The SET input to the circuit 110 drives the Q output thereof HI, which is supplied to one terminal of a quad NAND gate 112. This Q output signal is also supplied to the inverting input of a comparator 114, driving the output thereof LO. The output signal of the comparator 114 then energizes the power supply 68 to produce the voltage $V_{CC}$. This voltage is also supplied, on a somewhat delayed basis, to the non-inverting input of a comparator 116, driving the output thereof HI. This signal is supplied to the $\overline{\text{RESET}}$ terminal of the controller 56, thereby disabling the RESET function and energizing the controller 56. The HI output of the comparator 116 also propagates through the NAND gates of the circuit 112, in conjunction with the STROBE output provided as a logic LO from the controller 56 upon energization, to place the ENABLE signal in a LO condition and the CS signal in a HI condition. The CS signal is used to energize the display 50.

The ENABLE signal is supplied as a logic LO to the SEL terminal of the power switch 92, which includes a QUAD 2 input/1 output multiplexer circuit 118. As can be seen in FIG. 4A, the circuit 118 has four outputs QA, QB, QC, and QD. Each of these output signals has a pair of input terminals. In the quiescent POWER OFF condition of the programmer 16, the outputs QA-QD assume the same state as the input terminals I1A-I1D. Inputs I1A and I1B are fixed at a logic HI condition by a connection to the voltage source VB, whereas the input terminals I1C and I1D are fixed at a logic LO level by connection to circuit ground.

Upon occurrence of a POWER ON condition as evidenced by a logic LO on the ENABLE terminal connected to the SEL terminal of the circuit 118, the state of outputs QA-QD is determined by the logic level appearing on the terminals I0A-I0D. The logic state appearing at these terminals is determined by the controller 56.

The output QA is connected to the read/write inputs of the RAM circuits, 82 and 84. Input QB is connected to the control terminal of latch circuit 85. Outputs QC and QD are connected to reset terminals of the dual flip-flop 110.

Once the controller 56 has executed the operations called for during the POWER ON condition, the controller 56 energizes the input I0D of the device 118. This in turn operates the reset terminal of the flip-flop circuit 110, driving the Q output thereof LO, causing the POWER ON logic 64 to deenergize the voltage $V_{CC}$ of the power supply 68 and cause the microprocessor to be held in reset and the outputs of circuit 118 to be controlled during the loss of $V_{CC}$ to the microprocessor.

Keypad Operation:

As was stated previously, a logic HI at any of the inputs of the encoder 94, shown in FIG. 4, will generate a POWER ON condition to activate the intermittent voltage supply $V_{CC}$. These circumstances include: depression of a switch on the keypad 48, a periodic pulse on the clock line 120, connection of the socket 52 to the computer interface device 22, or operation of the switch 54.

When any key of the keypad 48 is depressed, a column terminal is shorted to a row terminal. Since all of the columns are HI due to the logic HI at terminal 100 of decoder 90, the row of the actuated key will also be placed at HI. This HI signal to the priority encoder 94 causes the GS output to go HI, which initiates a power-on condition and turns on the controller 56.

The controller 56 then looks at the output of the encoder 94 to determine which of the row conductors of the keypad 48 has been energized. The controller 56 must still determine which column indicator has been energized.

Upon activation of the power-on circuitry, the $\overline{\text{EN ABLE}}$ output of the power-on circuit 64 (connected to terminal 100) has gone LO, energizing the controller 56. The controller 56 now selectively changes the state of the inputs of decoder 90 to sequentially provide the following binary signals thereon: 000, 001, 010, and 011. Each of these codes provided at the input of the decoder 90 forces exactly one of its outputs connected to the keypad column terminals to go LO. After each output code, the state of bus 96 from the encoder 94 is again read. When the encoder output of whatever row terminal of the keypad was HI changes to LO (that is, no keypad row terminal is HI), the proper column connected to the depressed key switch has been identified. Since the row and column have now been found, the key which has been depressed can be determined from a simple look-up table.

Components suitable for use in the circuits which are illustrated in the Figure are shown in Table IV below.

TABLE IV

| Reference Character | Circuit Component Type |
|---|---|
| 20 | HP-85 |
| 48 | Grayhill 88-YY-3616B |
| 50 | IEE 3802-03-032 |
| 56 | Mostek 38P70 |
| 82 | TC5564 |
| 84 | TC5564 |
| 85 | 74C373 |
| 90 | 74C42 |
| 92 | MM74C157 |
| 94 | MC14532B |
| 110 | MC4013B |
| 112 | MC14011B |
| 114 | LM3302 |
| 116 | LM3302 |
| 126 | MM5368 (clock oscillator) |
| 128 | 32.768 KHz (crystal) |
| 202 | 25 pf |
| 204 | 100 KΩ |
| 206 | 5 to 15 pf |
| 208 | 0.1 μf |
| 209 | 0.1 μf |
| 210 | 1 KΩ |
| 212 | 10 KΩ |
| 214 | 15 KΩ |
| 216 | Type 2N2907A |
| 218 | 0.1 μf |
| 220 | 51 KΩ |
| 222 | 51 KΩ |
| 300 | MC6808 |
| 302 | HM6514 |
| 304 | HM6514 |
| 318 | 54-LS156 |
| 320 | 54-LS138 |

D. Programmer Operation

In operation, the programmer 16, once powered up, assumes a plurality of different operational states, each of which is characterized by a distinctive output on the display device 50. The definitions of the various operational states of the programmer 16 are shown in Table V, wherein the first column represents the number of the operational state, the second column shows the message which is presented to the operator by the display 50, the third column provides a description of the operational state, and the fourth column shows the keys which the programmer controller 56 will interpret as an allowable input for that operational state.

TABLE V

State Definitions

| State No. | Message | Description | Keys |
|---|---|---|---|
| 0 | Ready to be initialized | Power-up condition | RSET- ST1 TEST- ST0 |
| 1 | Rate ID:XX | Ready to accept new rate ID, but showing old ID number | RSET- ST1 NEXT- ST3 NO. - ST2 TEST- ST1 |
| 2 | As #1 with new numbers | Have received new rate ID number | RSET- ST1 NO. - ST2 CLR - ST1 ENTR- ST3 or - ST31 |
| 3 | Rate ID not stored | Have received Illegal new rate ID number | RSET- ST1 CLR - ST1 |
| 4 | KH ID:XX | Ready to accept new KH ID, but showing old ID number | RSET- ST1 NO. - ST5 NEXT- ST7 or ST6 |
| 5 | Same as #4, but showing new numbers | Have received new KH ID number | RSET- ST1 NO. - ST5 CLR - ST4 ENTR- ST6 or - ST7 |
| 6 | KH ID not stored | Have received illegal KH ID | RSET- ST1 CLR - ST4 |
| 7 | KH=XXX.XX SP | Have received valid KH ID | RSET- ST1 NEXT- ST8 CLR - ST4 |
| 8 | VT Ratio:XXXXX | Ready to accept new voltage ratio, but showing old ratio | RSET- ST1 NO. - ST9 NEXT- ST12 |
| 9 | Same as #8, but shows new numbers | Have received new VT ratio | RSET- ST1 NO. - ST9 CLR - ST8 ENTR- ST12 |
| 12 | CT Ratio:XXXXX | Ready to accept new current ratio, but showing old ratio | RSET- ST1 No. - ST13 NEXT- ST14 |
| 13 | Same as #12 but shows new number | Have received new CT ratio | RSET- ST1 NO. - ST13 CLR - ST12 ENTR- ST14 |
| 14 | Meter ID: XXXXXXXXX | Ready to accept new meter ID number, but shows old ID | RSET- ST1 NO. - ST15 NEXT- ST20 |
| 15 | Same as #14, but shows new ID | Have received new meter ID number | RSET- ST1 NO. - ST15 CLR - ST14 ENTR- ST20 |
| 20 | Ready to program | Waiting to program meter | RSET- ST1 GO - ST24 NEXT- ST14 |
| 24 | Meter XXXXXXXXX programmed | Finished programming a meter | RSET- ST1 Next- ST14 |
| 30 | Device ready press RSET | Have finished initialization from EPR-500 | RSET- ST1 |
| 31 | Rate ID:XX is for EMF-XX | Have received valid Rate ID | RSET- ST1 CLR - ST1 NEXT- ST4 |

State #0 represents the condition of the programmer 16 when operating power is initially provided. At this point, the only allowable key inputs are RSET and TEST. Pressing the TEST key results in the controller 56 executing a number of diagnostic routines which check for proper operation of the display device 50, the RAM memories 66, and the read only memory which stores the program instructions and is part of the controller 56. Successful completion of the diagnostic procedures results in the controller returning to state #0.

If the RSET key is pressed at state #0, the controller enters state #1. At this point, the programmer 16 is ready to accept a two digit rate schedule ID number from the operator indicating which of four rate schedules (previously downloaded from the master processor 20 and stored in programmer RAM) is desired to be programmed into the meter.

The entered rate schedule ID number will now be presented on the display, giving the operator the choice of resetting, clearing, or entering the previously selected rate schedule ID number. ENTR results in the controller proceeding to either state #3 if an illegal rate ID was entered, or state #31, which presents the entered ID number, and also designates the type of electronic register for which this rate schedule is appropriate. As explained previously, a plurality of types of electronic registers varying in capabilities and sophistication may be programmed by the programmer 16. If the operator is satisfied with the selected rate schedule, he presses the NEXT key which results in the programmer assuming state #4. At this point the programmer is requesting the operator to enter an energy constant identification number which identifies a unique energy constant (KH) which is one of the set of such constants previously transmitted by the master processor 20 to the programmer 16.

Once the operator provides a KH ID number through the keyboard, this number is presented on the display to give the operator a chance to either clear the number or enter it. If entered, a check is made to determine if the KH ID number is valid. If so, the controller enters state #7 and presents on the display the number of kilowatt-hours per revolution. A legend "SP" or "PP" also appears, indicating that the selected KH is for a single phase or polyphase meter.

If the operator is satisfied with the results of his entry of KH ID number, he presses the NEXT button which results in the controller entering state #8. At this point, the display message requests the operator to provide the transformer ratio of the voltage transformer utilized by the meter 12. After entry of the transformer ratio, the programmer calls for corresponding entry of the current transformer ratio. Following successful entry of this item, the controller at state #14 calls for the unique ID number to be assigned to this meter.

Successful entry of the meter ID number results in the legend "ready to program" at state #20. At this point, the operator positions the programmer 16 in proximity to the meter 12 such that the optical interface 24 of the programmer is coupled to the optical interface 28 of the meter register 14. The operator then presses the GO button 54 to initiate a programming operation. The data is then transferred across the optical interfaces 24 and 28 through the controller 76 to the RAM 78 of the meter. If the programming operation is successful, appropriate messages are sent from the register 14 back across the interfaces 28 and 24 to the controller 56, resulting in the programmer 16 entering state #24 to provide the length on the display 50 to indicate that the meter having the displayed ID number has been successfully programmed.

As can be seen at state #30 in Table V, a downloading or initialization, operation from the master processer 20 is controlled by that device, not from the programmer 16. However, successful initialization of the programmer 16 is indicated by the programmer 16 entering state #30 and providing the display message shown.

Figure 5:
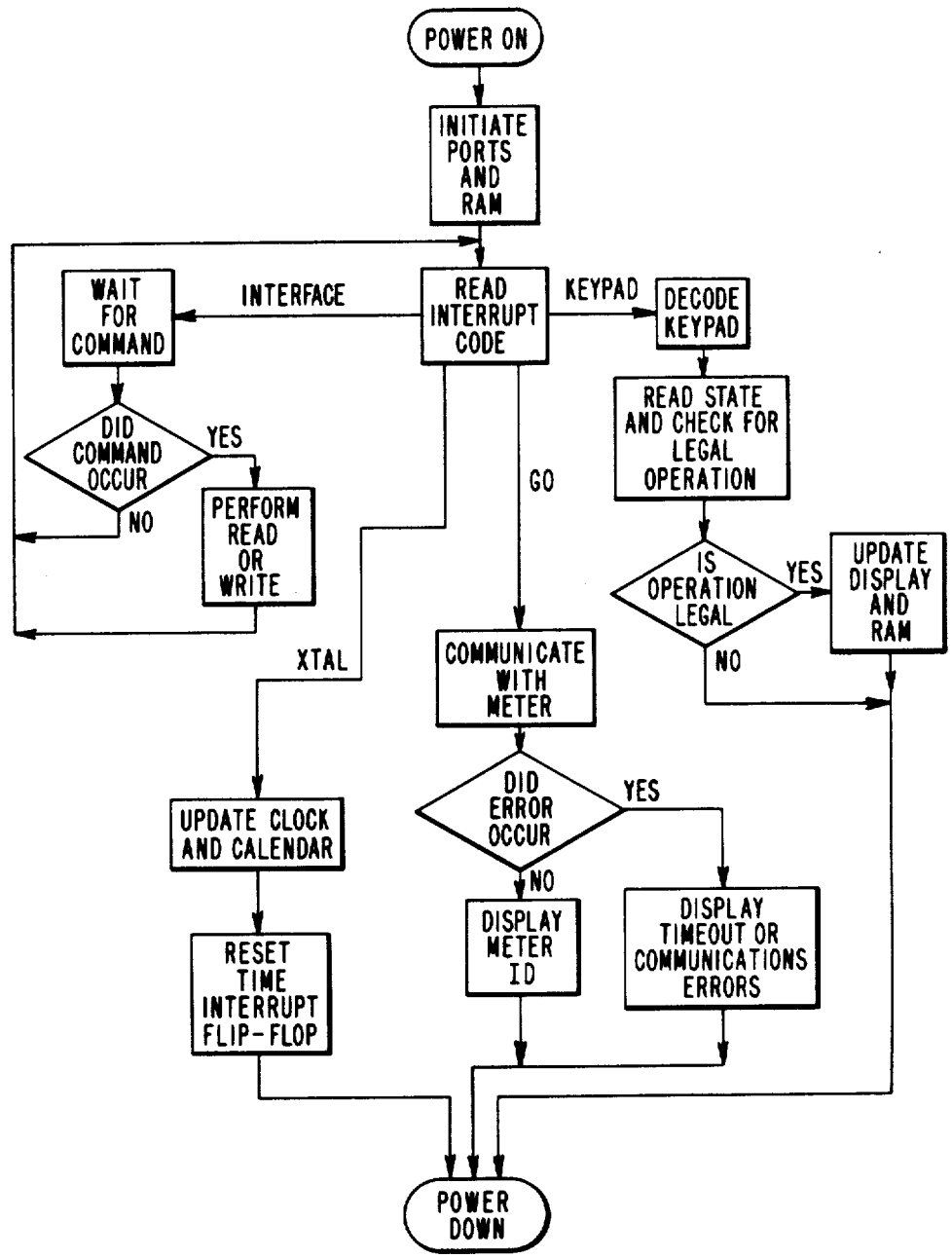
FIG. 5 is a flowchart of the overall program controlling the sequence controller of FIG. 4.

Operation of Controller 56:

The sequence controller 56 contains an on-board read only memory which contains microprocessor operating instructions to provide the functions of the programmer 16. The general program flowchart shown in FIG. 5 shows the sequence of operations for the controller 56. When power is first supplied to the power supply 68, a routine is entered to initialize the input/output ports and transfer default values of various operating parameters from the read-only memory to the random access memory devices 82 and 84. The parameters transferred include default values for current transformer ratio, voltage transformer ratio, meter I.D. number, Kh I.D. number and rate I.D. number.

Figure 6:
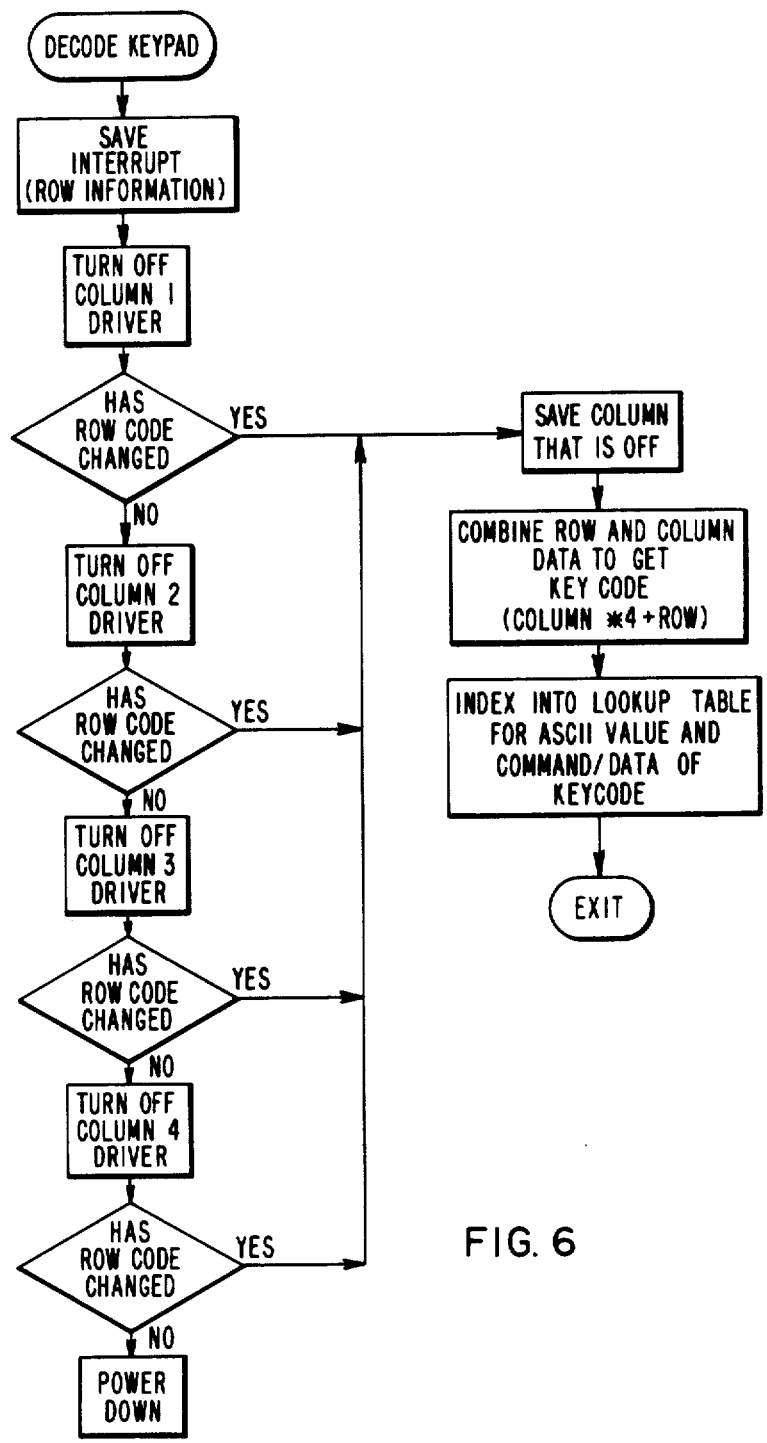
FIG. 6 is a flowchart of the DECODE KEYPAD routine shown in FIG. 5.

The system then enters an idle state until any of these interrupt conditions occurs: a switch on the keypad 48 is depressed, a one-second clock tick occurs, the GO button is depressed, or a computer interface device is plugged into the programmer 16. When one of these actions occurs, the processor determines which action is called for and enters the appropriate routine. For example, if a keypad depression has activated the controller, the DECODE KEYPAD routine is entered as shown in FIG. 6. The interrupt code is examined for the purpose of explaining why a power-up condition occurred. Next the processor supplies an output signal to the decoder device 90 to selectively de-energize each column terminal of the keypad 48. In the manner previously described, the row and column information of the depressed key switch is obtained. This information is then utilized to generate a key code which becomes an index to a look-up table to determine the ASCII value for this key. Also, the command/data of the key code is obtained. The command keys (i.e. TEST, NEXT, RSET, ENTER, CLR) have no ASCII value, but there is a value assigned to these keys that tells the program that they are commands and which command they are.

Figure 7:
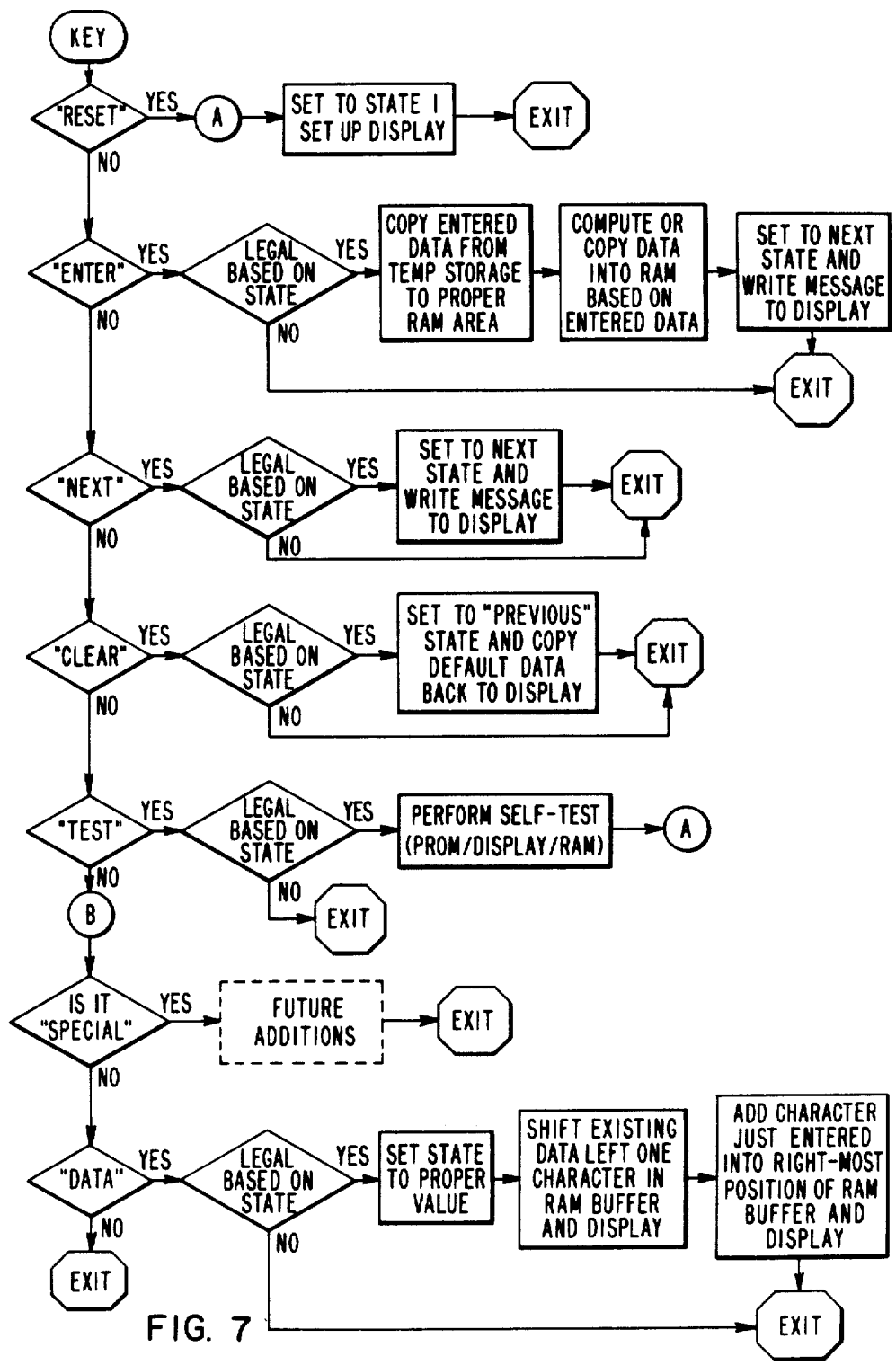
FIG. 7 is a flowchart of the UPDATE DISPLAY AND RAM routine of FIG. 5.

The DECODE KEYPAD routine, which is shown in FIG. 6, is then exited and a routine entered as shown in FIG. 5 to determine the present state of the programmer 16, as set forth in Table V, and to determine if this key operation is legal for the current programmer state. If not, the programmer enters a power-down mode. If the key command is legal for the present programmer state, then the UPDATE DISPLAY AND RAM routine is entered. Various portions of this routine are executed, depending upon which key has been depressed as shown by its flowchart which is illustrated in FIG. 7.

The RSET key causes the programmer to enter state #1 and set up the display. This consists of the following: Store a #1 in the "state" memory location, write out the message "RATE ID:" and get the last entered rate number and write it to the display. Following the display set up, the power-down state is entered.

If the ENTR key has been depressed, a check is made to determine if this key is a legal entry for the current state of the programmer. The program checks for legal keypad entry based on the present state (i.e. before the keypad was hit) and, if legal, does the display update and RAM operations.

If the ENTR key is legal, then the data previously entered through keypad operation (KH ID, transformer ratios, etc.) is copied from temporary storage into the proper RAM area. The routine then computes or copies data into RAM based on the entered data. For example, once a valid rate schedule I.D. is selected, the entire data set for that rate schedule is copied to the proper RAM area and the pointers within the data set are set up.

The routine then advances the programmer to the next state, writes an appropriate message to the display, and exits.

The NEXT key, if legal based on the present state of the programmer, causes the programmer to advance to the designated state of Table V, write the appropriate message to the display, and exit.

The CLEAR key, if legal, returns the programmer to the previous state, copies default data back to the display, and exits. The TEST key, if legal, causes the controller 56 to execute a series of self-test routines to verify the proper operation of the PROM, display device, and RAM memory devices. The programmer is advanced to state #1 and the proper values presented on the display.

The UPDATE DISPLAY AND RAM routine also includes the capability to add additional programmer functions in the future, using additional key codes which may, for example, be generated by the sequential actuation of the keys of the keypad 48.

If a number key (0–9) has been entered and determined to be legal, the state of the programmer is advanced to the next level, existing data in the RAM buffer and display is shifted one character to the left, and the newly entered character positioned in the rightmost position of the RAM buffer and the display. The routine is then exited and the programmer enters a power-down condition.

Figure 8:
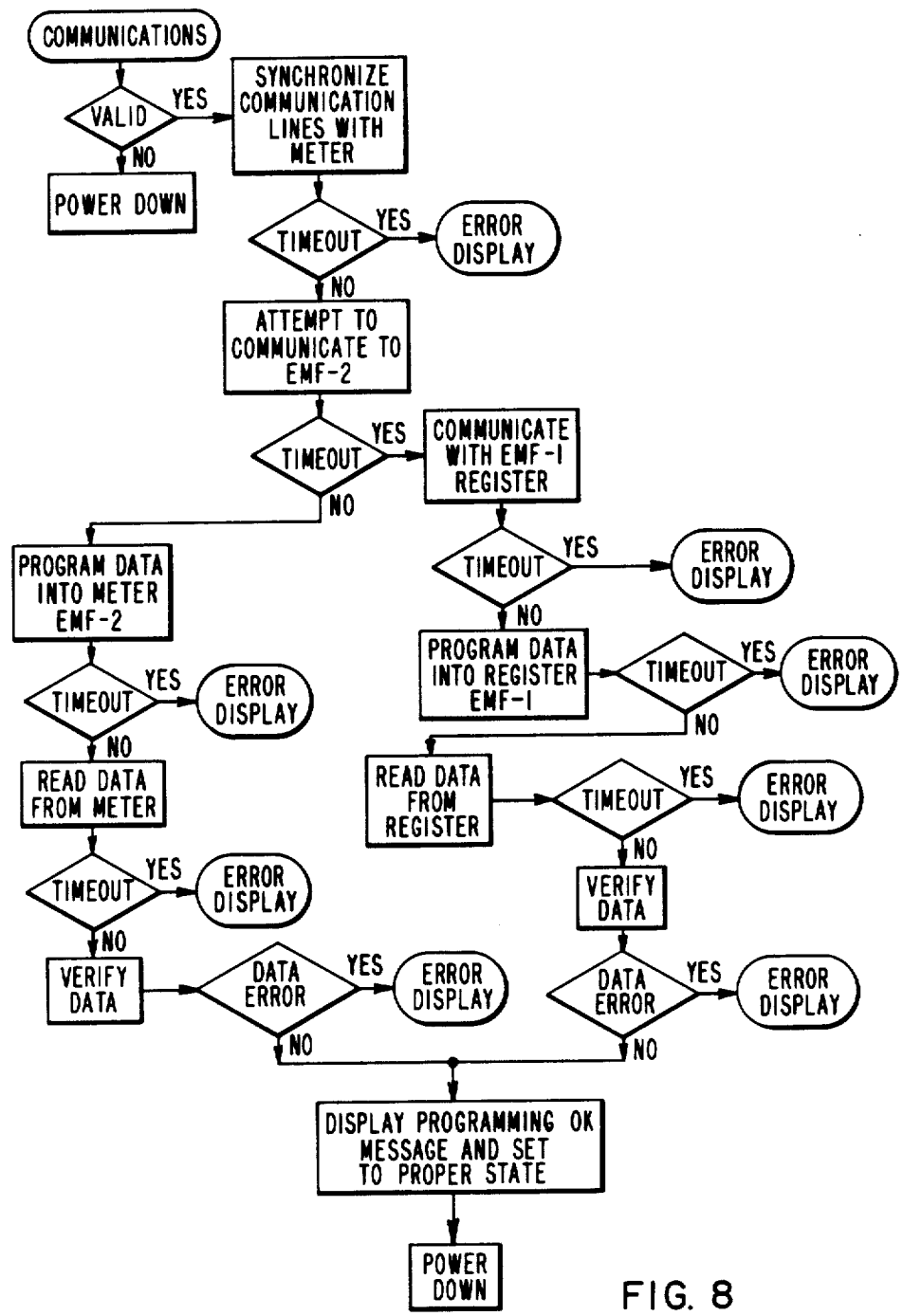
FIG. 8 is a flowchart of the COMMUNICATIONS routine of FIG. 5.

If actuation of the GO switch 54 has caused the controller to be energized, the COMMUNICATIONS routine of FIG. 8 is entered. The logical operational sequence of the COMMUNICATIONS routine is illustrated in the flowchart of FIG. 8. Although the GO switch 54 is not on the keypad, it is a valid operation only for a particular state. The state must be checked before the communications routine is entered.

Figure 9:
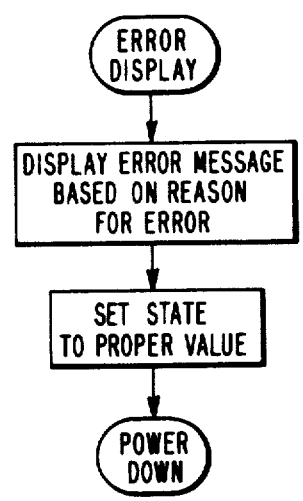
FIG. 9 is a flowchart of the ERROR DISPLAY routine of FIG. 5.

Appropriate output signals are generated on the bus 106 to the optical port 24 to initiate communication with the associated electronic register. The specific protocols utilized to establish this communication are more completely described in the aforementioned U.S. Pat. No. 4,298,839. If successful communications interchange is not established within a predetermined time, a time-out error has occured and the ERROR DISPLAY is entered. A simplified logical flowchart of the ERROR DISPLAY is illustrated in FIG. 9. Once initial communication is established, a keyword command is sequentially generated to the optical port 24 to cause a first type of electronic register to respond by sending back a predetermined response consisting of the entire contents of its RAM memory. If this "memory dump" message is not received in a predetermined time period, then the controller generates an outgoing communication including a different keyword command to cause a second type of register to respond with a different predetermined message. If this second message is not received in a specified time period, the controller continues to generate keywords for as many type of registers as the controller is designed to communicate. In the embodiment disclosed, only two types of registers are provided. If no proper responses are received, then an error message is displayed.

Once successful communication has been established and the coupled register verified to be the type compatible with the selected rate schedule, operator-entered data and data previously downloaded from the master processor 20 is sequentially transferred into a communications buffer in RAM in a format which is an image of the meter RAM. Groups of data, each preceded by an appropriate keyword, are then transferred from the communications buffer over the optical interface ports 24 and 28 to the register 14.

For an initial installation of a register and meter, the following keywords and corresponding meter data are transferred:

| Keyword # | Data |
|---|---|
| 1 | Time data |
| 2 | Permanent data |
| 3 | Programmable data |
| 4 | Modifiable data |

The format for these data blocks is dependent on the register type. Formats for one particular type of register usable with the present invention are set forth in the aforementioned U.S. Pat. No. 4,283,772 and are reproduced here as Table VI.

TABLE VI
EXTERNAL RAM DATA
Four Bit (D3-D0) by 256 Word Memory

| DATA IEM | MNEMONIC | DATA DESCRIPTION |
|---|---|---|
| 1 | SCNT | Seconds Counter-Six bit binary counter, counts down from 60 to 0 at 1 count per second rate. |
| 2 | MCNT | Minutes Counter-Six bit binary counter, counts down from 60 to 0 at 1 count per minute. |
| 3 | HCNT | Hour Counter-Five bit binary counter, counts down from 24 (starting at 12:00 midnight) to 0. |
| 4 | MP | Pulse initiator constant-1 bit binary constant. Set to 0 for MP = 2 (two pulses per disc. rev.) Set to 1 for MP = 4. |
| 5 | YR 1 | Day of Year 1-2 BCD digits for the day of the year counter. |
| 6 | YR 2 | Day of Year 2-One half a BCD digit for the hundreds digit of day of year. |
| 7 | LP 0,1 | Leap year counter-2 bit binary counter. Counts a 4 year cycle with 00 indicating leap year. |
| 8 | DOWK | Day-of-week counter-three bit binary counter, counts down from 7 (Sunday) to zero. |
| 9 | PLSFLG | Pulse Initiator Flag-Bit indicates status of the pulse initiator inputs. |
| 10 | PIBIT | Pulse Initiator Flag-Bit indicates status of the pulse initiator output. |
| 11 | DAY CHG. | Day Change Flag-Status Bit is set to 1 when clock time changes from 11:59:59 pm to 12:00:00 midnight. |
| 12 | 7/365 | Calendar Flag-Control Bit which determines calendar cycle. When set to 1, the register repeats a 7 day cycle. When set to 0, it runs on a 365/366 day, 4 year cycle. |
| 13 | DSTS | Daylight Savings Time Set-Status bit which is set to 1 at midnight of DST start day and reset at 2:00 a.m. when actual DST adjustment is made. |
| 14 | DSTR | Daylight Savings Time Reset-Status bit serving similar function as described for DSTS except used when going from DST to standard time. |
| 15 | HLDY | Holiday-Status bit, set to a 1 at midnight of start of holiday as defined in data table. Bit is reset to zero at the end of the day. |
| 16 | SUM/WIN | Summer-Winter-Status bit, set to 1 at the start of the "summer" rate schedule season and reset to zero at the start of the "winter" season. |
| 17 | HADR | Holiday Address-8 bit address which points to the RAM location of the next holiday, DST change or season change to be encountered. |
| 18 | DPFLG | Bits are control flags to enable the display for a given quantity. A 0 bit inhibits the display and a 1 enables. The flag bits are: Day of Year (DAYR) Total KWH (TKWH) Peak KWH (PKWH) Shoulder KWH (SKWH) Base KWH (BKWH) Peak KWD (PKWD) Shoulder KWD (SKWD) Base KWD (BKWD) |
| 19 | RPKWD | Maximum KWD, Peak Rate-Represents the maximum KW demand metered during the peak rate periods but subsequent to the last external reset operation. BCD format: $10^{-2}$ digit, $10^{-1}$ digit, Unit's digit, Ten's digit, Hundred's digit. |
| 20 | RSKWD | Maximum KWD, Shoulder Rate-Similar to RPKWD except applies to shoulder rate periods. |
| 21 | RBKWD | Maximum KWD, Base Rate-Similar to RPKWD except applies to base rate periods. |
| 22 | RTKWH | Total KWH-Represents the cumulative KWH registered by the meter. BCD format: Unit's digit, Ten's digit, Hundred's digit, $10^3$ digit, $10^4$ digit. |
| 23 | RPKWH | Peak Rate KWH-Similar to RTKWH except cumulative KWH consumption is during the peak rate periods only. |
| 24 | RSKWH | Shoulder Rate KWH-Similar to RTKWH except KWH consumption is during shoulder rate periods. |
| 25 | RBKWH | Base Rate KWH-Similar to RTKWH except KWH consumption is during the base rate periods. |
| 26 | CPKWD | Cumulative KWD, Peak Rate-Cumulative KW demand metered during the peak rate periods. Format is similar to RPKWD. |
| 27 | CSKWD | Cumulative KWD, Shoulder Rate-Similar to CPKWD except metered during the shoulder rate periods. |
| 28 | CBKWD | Cumulative KWD, Base Rate-Similar to CPKWD except metered during the base rate periods. |
| 29 | TDINT | Time of Demand Interval-This is an 8 bit counter which represents the elapsed time in the current demand interval. It counts down in 1 minute increments. |
| 30 | INTDEM | Current Interval Demand-This represents the demand accumulated during the current interval. It is reset at the end of each demand interval. |

TABLE VI-continued
EXTERNAL RAM DATA
Four Bit (D3-D0) by 256 Word Memory

| DATA IEM | MNEMONIC | DATA DESCRIPTION |
|---|---|---|
| 31 | TKWH | The format is similar to RPKWD. Fractional KWH-This is a 20 bit binary count which represents the pulses counted but which do not equal a full KWH. |
| 32 | TKWD | Fractional KW demand-This is a 20 bit binay count which represents the pulses counted but which do not equal a full 1/100 of a kilowatt. |
| 33 | BTLOG | Battery Use Log-Represents the elapsed time which the unit has operated on battery power. This is a 20 bit binary number. Each count equals 4 seconds of battery operation. |
| 34 | LDCR | Load Control-Control bit for the load control function. This is programmed to a 1 if the relay is to be used as a load control output relay. |
| 35 | MIN.CHG. | Minute Change-Flag bit is set when SCNT counts down to zero or when the register is accessed by the Programmer Reader. The next pass through the main program updates the minutes count and clears this bit. |
| 36 | PIFLG | Pulse Initiator Flag-Control bit for the pulse initiator function. This is programmed to a 1 if the relay is to be used as a pulse output. |
| 37 | NCODE | New Code (Security)-This is a "random" BCD number which is generated by the register each time it is read. It may be used to detect tampering. |
| 38 | OCODE | Old Code (Security)-This is the binary word from the NCODE location above which is moved to the OCODE location each time any register value is changed (including time and date). |
| 39 | TORSP | Top, Rate Switch Points-This is an 8 bit address which points to the external RAM location which contains the first word of the rate switch point table. |
| 40 | TPADR | Top, Address, Date Table-This is an 8 bit address which points to the external RAM location which contains the first word of the date table. |
| 41 | RIDC | Rate Identification Code-This is a 4 bit number assigned to a given set of rate schedule data. |
| 42 | MIDC | Meter Constant Identification Code-This is a 4 bit number assigned to a given set of meter constant data. |
| 43 | METID | Meter Identification-This is a 9 digit BCD constant assigned to uniquely identify a given register. |
| 44 | XFMR | Transformer Ratio-This is a 7 digit BCD constant which represents the metering transformer ratio used with a given register. The register KW and KWH readings can be multiplied by this value to obtain primary readings. |
| 45 | KE | Meter KWH Constant-This is the constant which the register uses (together with the multiplier defined by KWHM) to convert input pulses to KWH readings. KE is stored as a negative, 12 bit, binary integer. |
| 46 | KWHM | Meter KWH Constant Multiplier-This is a 4 bit binary number which points to the decimal multiplier for KE as follows: |

| KWHM | Multiplier |
|---|---|
| 0 | 10 |
| 3 | 100 |
| 6 | 1000 |
| 9 | 10000 |
| 12 | 100000 |
| 15 | 1000000 |

| DATA IEM | MNEMONIC | DATA DESCRIPTION |
|---|---|---|
| 47 | DINT | Demand Interval-This is a constant which sets the time period or length of the demand interval. It is an 8 bit binary number. |
| 48 | KD | METER KWD Constant-This is analagous to the KE constant and is used to convert pulses to KWD readings. |
| 49 | KWDM | Meter KWD Constant Multiplier-This is analgous to the KWHM multiplier except it is applied to the KD value. |
| 50 | CHKSM | Check Sum-This is a check sum consisting of two hex digits, used to verify the meter constant. |
| 51 | RATE SWITCH POINTS AND | Remainder of RAM-The remainder of the RAM locations are used as a buffer for storing rate switch point data and dates. There are 120 four bit words available and the buffer can be made up |
| 52 | DATE CODES | of any combinations of switch points (4 words each) and dates (3 words each). The format for these items is specified below. The starting address for the switch points is defined by TORSP and the dates start at the location specified in TPADR. |

Rate Switch Points—4 words each.
Switch points for each type of day are arranged in chronological order in contiguous location of RAM.
Type of Day code:
00=Weekday
01=Saturday
10=Sunday
11=Holiday
Load Control bit:
0=off
1=on
Season:
0=Season 0
1=Season 1
Rate Code:
00=Base
01=Shoulder
10=Peak
11=(Unused)
Hour Code:
The five bits specify the hour of day the rate switch is to occur counting down (in binary) from 24 to 0.
Minutes Code:
These four bits specify the number of minutes after the hour when the rate switch is to occur. It is a binary number which counts down from 60 to 0 in 5 minute increments.
Date or Holiday Coding—3 words each.
Note: Dates must be arranged in chronological order in contiguous locations of the RAM:

Word 0—Four bit BCD digit representing the LSD of the day of year.

Word 1—Four bit BCD digit representing the ten's digit of the day of the year.

Word 3—Day code (defines the significance of the date):
00=Holiday date
01=DST Set Date
10=DST Reset Date
11=Season Change Date Word 3 also contains a two-bit BCD number which represents the hundreds digit of day of year.

For EMF-1A, keyword 1 is read all memory, keyword 2 is write all but DATA items 19-33, 37 and 38; keyword 3 is write all but DATA items 22-33, 37 and 38 and keyword 4 is write all but DATA items 37 and 38.

When the data transfer to the register 14 is complete, the controller sequentially sends additional keywords to the register 14 to transmit the same data from the register RAM 78 through the register optical port 28 and controller optical port 24 to the programmer RAM communications buffer. If the data retransmitted from the register 14 to the controller 76 matches the original data transferred in the opposite direction, the controller advances to the next state and displays the "programming okay" message, and exits the routine.

If the programmer 16 does not receive an expected message from the register 14 within a predetermined time, an error display routine as shown in FIG. 9 is entered An error message is generated and presented on the display to communicate to the operator the reason for the malfunction. Allowable error message are as follows:

| ERROR CODE | ERROR CONDITION/ PROBABLE CAUSE |
|---|---|
| 1 | After programmer/reader addressed register for data transfer, programmer/reader did not receive register response Programmer/reader probe not aligned with register optical port. |
| 2 through 7 | Programmer/reader stopped receiving data before data transfer was complete. Programmer/reader probe moved during data transfer. |
| 8 | Programmer attempted to program wrong meter type for rate selected. |
| 12 | Register time is wrong. |
| 16 | Programmer/reader unable to verify register data. Possible EMF register malfunction. |

After display of the error message, the controller is advanced to the proper state as shown in the state definitions of Table V. The routine is then exited.

Figure 12:
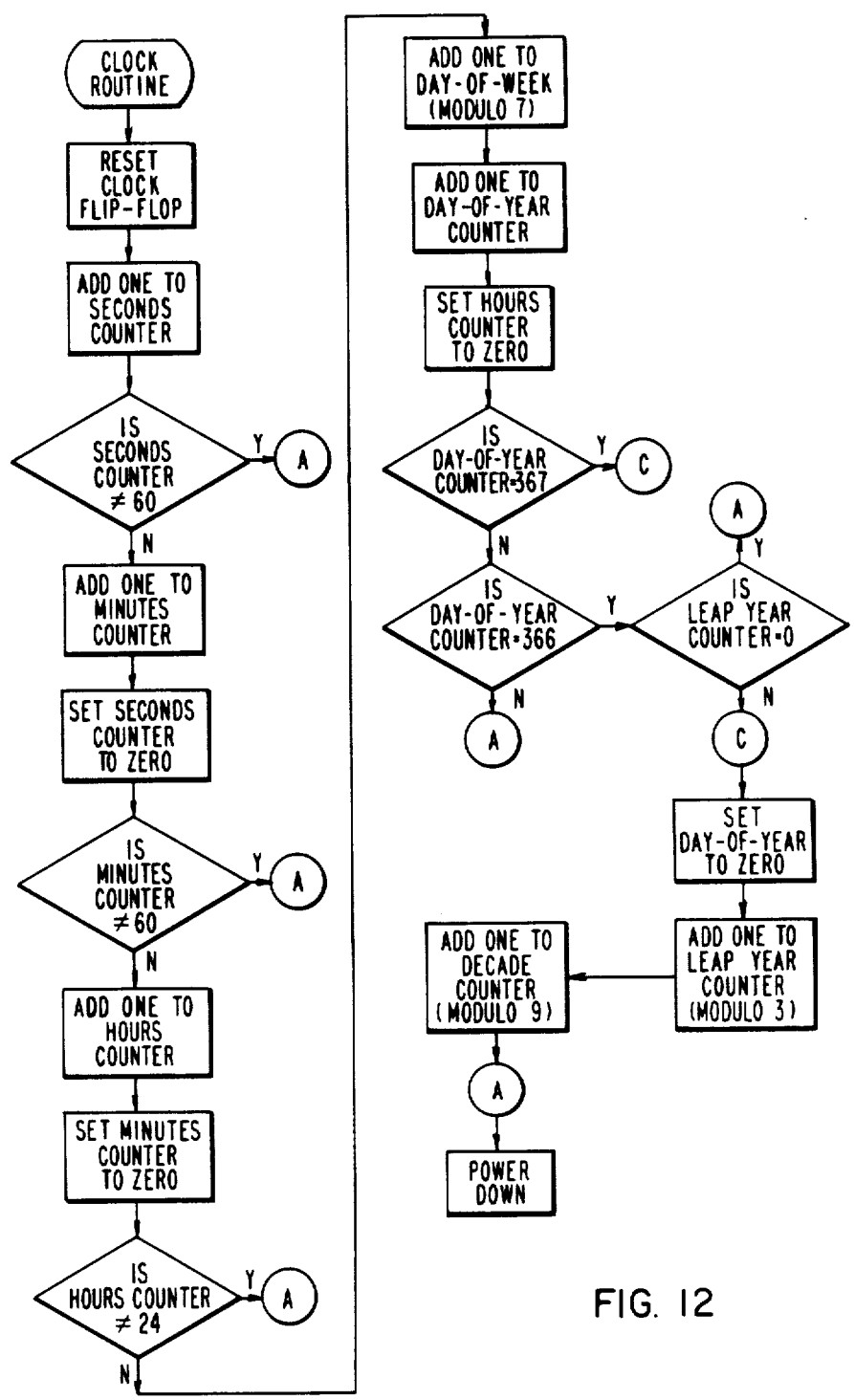
FIG. 12 is a flowchart of the CLOCK routine of the present invention.

If the controller has been powered up due to a one second clock tick occurring, then the running clock register at the top of RAM in the programmer 16 is updated. The clock consists of seconds, minutes, hours, day of the week, day of the year, and a composite word containing information designating the decade and a leap year counter. Next, the timer interrupt flip-flop is reset and the routine exited. A logical flow chart of this operation is illustrated in FIG. 12.

If the controller 56 was powered up due to a logic HI signal on the line 104 from the computer interface, the controller 56 enters a wait state looking for an appropriate keyword coming from the master processor 20 via the computer interface device 22 through the socket 52.

Data is then transmitted to the programmer from the processor 20 in a series of pairs of messages, with the first message of each pair including the length of the second message and the address where the second message data is to be stored in programmer memory.

The first pair of messages transmitted includes the current time data as shown in Table III.

Next, a block of energy constants (each with an associated identifier) is transmitted and stored in RAM in the portion labelled "KH ID blocks" in Table III.

Finally, up to four blocks of rate schedules are transmitted, within each block is a rate schedule ID which will be used by an operator to select one of the schedules for transmission to an associated meter register. The rate schedules are stored in the portion of programmer RAM designated "Rate ID blocks".

At the conclusion of the downloading operation, the programmer returns to a wait state and remains there so long as the computer interface device 22 is attached to the socket 52. When the device 22 is disconnected, the programmer remains in the wait state for a short time and enters the power-down condition.

III. Computer Interface

Figure 10:
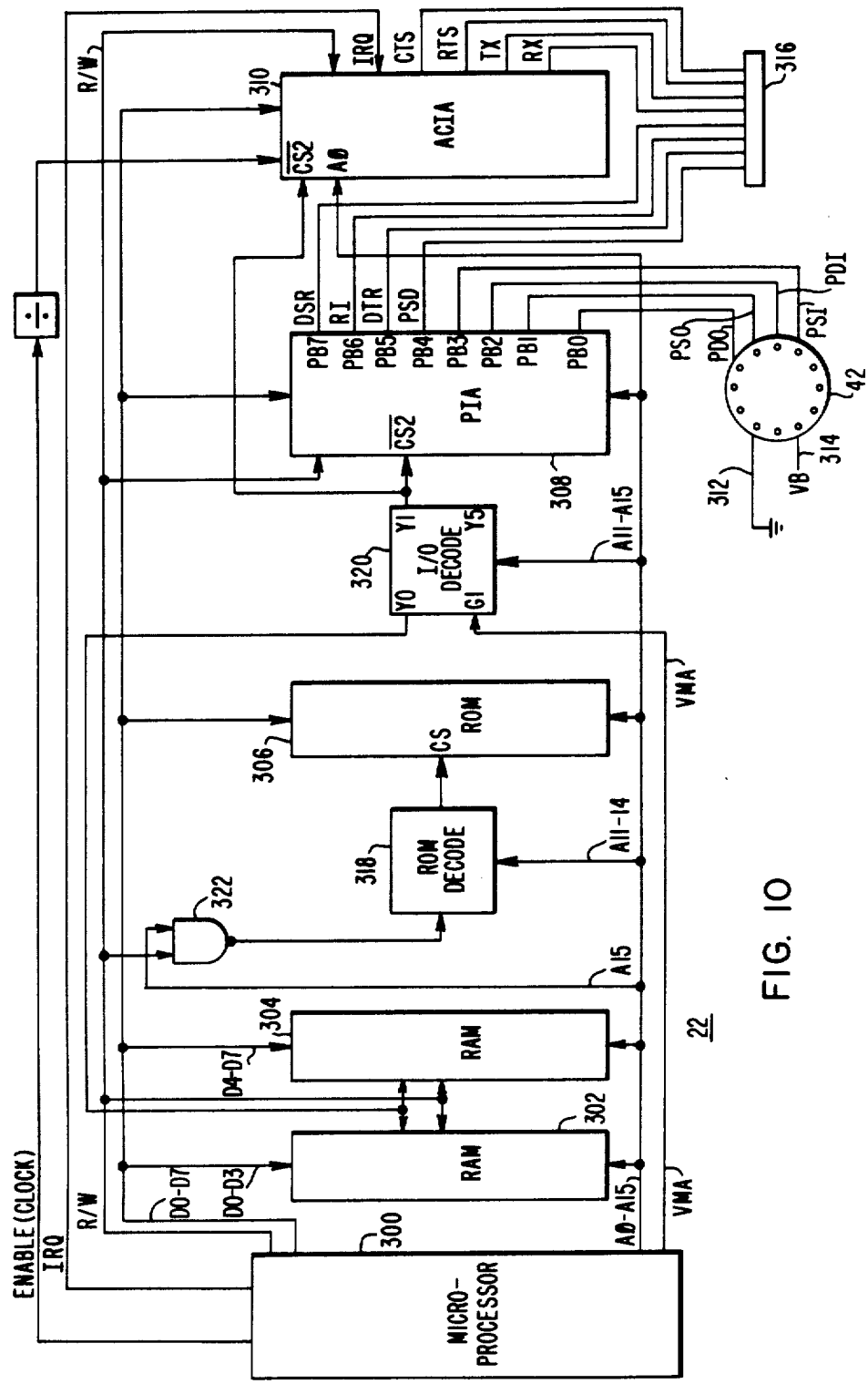
FIG. 10 is a schematic diagram of the computer interface device of FIG. 1.

Schematic Description:

A schematic diagram of the computer interface device 22 is shown in FIG. 10. As can be seen therein, the computer interface device 22 includes a microprocessor 300 which, in a preferred embodiment, is a type MC6808 microprocessor manufactured by the Motorola Corporation. The processor 300 includes an on-chip clock oscillator and driver and incorporates a memory-mapped input/output system. The microprocessor 300 is described in greater detail in the Motorola Microprocessors Data Manual published by Motorola, Inc.

The computer interface device 22 further includes a pair of read-write memory RAM devices, 302 and 304, a read only memory device 306, a programmable interface adapter (PIA) 308 and an asynchronous communications interface adapter (ACIA) 310.

The microprocessor 300 includes an eight-bit data bus D0–D7 and a sixteen-bit address bus A0–A15.

The PIA 308 functions as a dual input/output port for the microprocessor 300. Connected to I/O port lines PB0–PB3 are four communication lines PD0, PS0, PDI, and PSI, respectively, which constitute the four lines of the data communications interface which cooperates with the programmer 16. These four lines connect to the plug 42 shown in FIG. 1. Also connected to the plug 42 is a ground terminal 312, and a battery-charging line 314 connected to a power source. Also connected to the PIA 308, at lines PB4–PB7, are terminals of the RS-232C asynchronous serial communications port which cooperates with the master processor 20. The four lines connected to the terminals PB4–PB7 are the DCD, DTR, RI, and DSR terminals, respectively. These are standard terminals of the RS-232C interface, and function in a manner well-known to those skilled in the art. Remaining terminals of the RS-232C interface are connected to the ACIA 310, and include the terminals CTS, RTS, TX, and RX. The RS-232C terminals are terminated in a 25 terminal connector 316 and may be plugged directly into a compatible RS-232C serial interface connector of the master processor 20 or, as previously described, to a modem 40.

The read-write memory devices 302 and 304 of the preferred embodiment are type HM6514 random access memory (RAM) devices manufactured by the Harris Corporation. These devices are connected to the microprocessor 300 in a 1K by four-bit configuration, as shown in FIG. 10, to provide a 1K by eight-bit read-write memory.

Since the type 6808 microprocessor features memory-mapped input/output, address decoding is required to properly execute both memory operations and input/output operations. Accordingly, there is provided a ROM decode circuit 318 and an I/O decode circuit 320. The device 318 is shown in the preferred embodiment to be a type 54 LS156 decoder manufactured by the Signetics Corporation, and the decoding device 320 is preferably a type 54LS138 decoder manufactured by the Texas Instruments Corporation.

Address lines A11–A14 are supplied as input to the ROM decoder 318, which also is supplied with address line A15 and the read/write line from the microprocessor 300 through a NAND gate 322.

The computer interface device 22 is configured with the read-write memory as the lower ten bits of available addresses; that is, 0000–03FF. The read only memory of the computer interface device 22 is configured to run from F000–FFFF. Input and output through the PIA and ACIA is assigned the addresses 0818–081B and 2800–2801, respectively.

Accordingly, when a read only memory operation is called for, the address lines A11–A15 and the R/W line activate the ROM decoder 318 which in turn activates the CS terminal of the ROM 306. Similarly, read-write memory operations are enabled by the decoder 320 in response to address lines A11–A15 in conjunction with the Valid Memory Address line (VMA) of the microprocessor 300. The Y0 terminal of the decoder 320 is thus activated, which in turn activates the ENABLE terminal of the RAM devices 302 and 304, operated in conjunction with the R/W line from the microprocessor 300.

When the microprocessor 300 calls for an input/output operation through the PIA 308, the VMA line and address lines A11–A15 activate the decoder 320 and its output terminal Y1, which in turn activates the $\overline{CS2}$ terminal of the PIA 308. An input/output operation for the ACIA is similarly activated by the VMA line and address lines A11–A15 which cause the Y5 terminal of the decoder 320 to be activated, which in turn activates the $\overline{CS2}$ terminal of the ACIA.

Figure 11:
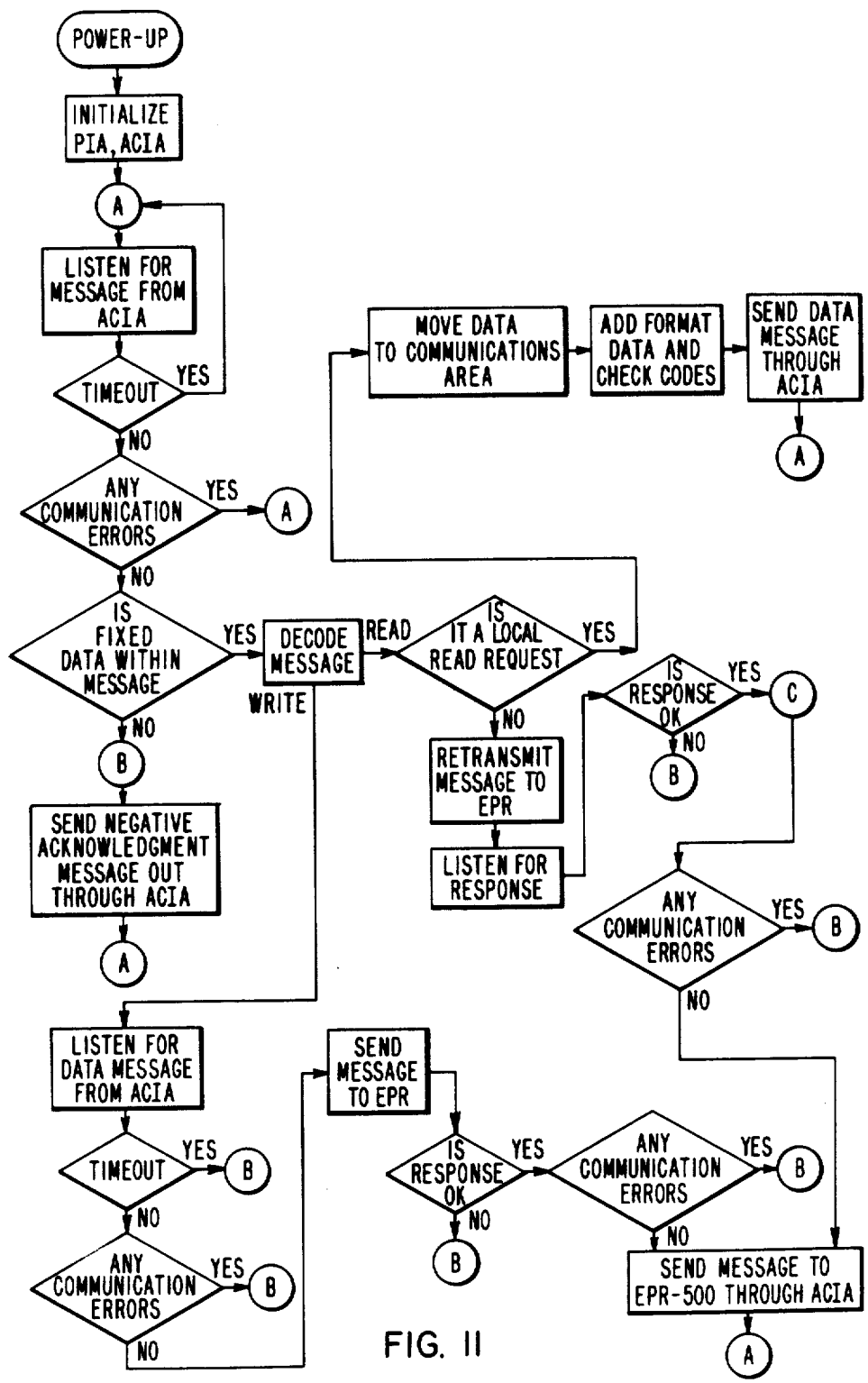
FIG. 11 is a flowchart of the interface device.

Operation of Computer Interface:

FIG. 11 illustrates a logical flow chart representing the operation of the interface/adapter. As can be seen from FIG. 11, the interface/adapter first initializes the PIA and ACIA and then monitors the ACIA for a message. After checking for communications errors, the interface/adapter determines whether or not fixed data exists within the message. If it does, the message is decoded and, if the request is a local read, the data message is sent through the ACIA. If the request was not for a local read, the message is retransmitted to the EPR and a response is awaited. After checking for communications errors, the messsage is sent to the EPR-500 through the ACIA.

The overall operation of the interface/adapter and its interactions with the PIA, ACIA and EPR are shown in FIG. 11.

What I claim is:

1. Apparatus for programming a time-of-use electric energy meter register, comprising:
   a portable programmer comprising a sequence controller, data communication means connected to said controller for receiving meter data for ultimate storage in an associated time-of-use meter register, read-write memory means connected to said controller for temporarily storing said meter data to be stored in an associated time-of-use electric energy meter register, meter interface means connected to said controller for transferring said meter data from said read-write memory means to an associated time-of-use meter register, operator input means connected to said controller for permitting an operator to initiate transfer of said meter data through said meter interface means, and a battery-operated power supply providing operating power for said programmer;
   a master processor comprising means for receiving operator-entered values of said meter data, processor means for organizing said values into a set of meter data in a predetermined format, means for storing a plurality of said meter data sets, data output means for selectively transmitting said stored meter data sets to said programmer; and
   interface means for removably connecting said data output means to said programmer data communication means.

2. Apparatus as recited in claim 1 wherein said meter interface means comprises means for transmitting said meter data set to an associated meter register via electromagnetic radiation.

3. Apparatus as recited in claim 2 wherein said transmitting means generates electromagnetic radiation having a wavelength shorter than 100 micrometers.

4. Apparatus as recited in claim 3 wherein said meter interface means and said data communication means are connected in parallel to said controller and operate according to a common communications protocol.

5. Apparatus as recited in claim 1 wherein said programmer comprises a data entry means for permitting an operator to enter data to be transferred to the meter register being programmed, and said controller is responsive to said data entry means to store said operator-entered data in said read-write memory means; and
   said controller further being responsive to said operator input means to transfer said meter data set and said operator-entered data from said read-write memory means through said meter interface means to a meter register being programmed.

6. Apparatus as recited in claim 5 wherein each of said meter data sets comprises a time-dependent rate schedule, and said controller is responsive to said data entry means to receive an operator-entered value selecting one of said plurality of rate schedules for transfer through said meter interface means to a register being programmed.

7. Apparatus as recited in claim 6 wherein each of said rate schedules includes data designating the type of register in which it is to be stored, and said controller generates one of a plurality of messages to an associated register dependent on the register type in response to an operator-entered command to transmit said selected rate schedule to an associated register.

8. Apparatus as recited in claim 7 wherein said meter interface means comprises bi-directional communications interface.

9. Apparatus as recited in claim 7 wherein said controller transmits said selected rate schedule to an associated register upon receipt of a message from the associated register in response to said generated message, and said controller produces an error indication if no message is received from the associated register within a predetermined time period following generation of said generated message.

10. Apparatus as recited in claim 1 wherein said interface means comprises a computer coupling means compatible with said processor data output means and removably connected thereto, and a programmer interface compatible with said programmer data communication means and removably connected thereto.

11. Apparatus as recited in claim 10 wherein said computer coupling means is adapted to receive data in an asynchronous serial data communication mode and said programmer interface is adapted to transmit data in a synchronous serial data communications mode.

12. Apparatus as recited in claim 11 wherein said computer coupling means is compatible with the RS-232C standard.

13. Apparatus as recited in claim 12 wherein said programmer interface comprises a pair of data lines and a pair of strobe lines.

14. A method for programming a programmable time-of-use electric energy meter register, comprising the steps of:
    entering values of a set of data for storage in a time-of-use electric energy meter register into an operator interface device of a fixed computer system;
    processing said values into a predetermined data set format;
    storing said data set in a mass memory storage system of said fixed computer system;
    coupling a portable meter register programmer to said fixed computer system;
    entering a command into said fixed computer system operator interface device to cause said fixed computer system to transfer said data set to said portable programmer;
    storing said data set in read-write memory of said portable programmer;
    coupling said portable programmer to a field installed time-of-use electric energy meter register;
    entering a command into said portable programmer to cause said portable programmer to transmit said data set to said register; and
    storing said data set in read-write memory of said register.

15. A method as recited in claim 14 comprising the additional steps of entering values of a plurality of sets of data for storage in a time-of-use electric energy meter register into said operator interface device of a fixed computer system;
    processing each of said data sets into said data set format;
    storing each of said data sets in said mass memory storage system;
    entering a command into said computer system operator interface device to cause said fixed computer system to transfer a selected plurality of said data sets to said portable programmer;
    storing said selected plurality of data sets in read-write memory of said portable programmer; and
    entering a command into said portable programmer to cause said portable programmer to transmit one of said data sets stored in read-write memory to said register.

16. A method as recited in claim 14 wherein the step of entering a command into said computer system operator interface device to cause said computer system to transfer said data set to said portable programmer comprises the intermediate steps of transferring said data set to a computer interface device, temporarily storing said data set in said computer interface device, and retransmitting said data set from said computer interface device to said portable programmer.

17. A method as recited in claim 16 wherein said data set is transmitted from said fixed computer system to said computer interface device in an asynchronous serial mode, and said data set is transmitted from said computer interface device in a synchronous serial mode.

18. A method as recited in claim 14 comprising the additional steps of:
    entering additional data to be stored in said register into said portable programmer after said data set is stored in read-write memory of said portable programmer;
    storing said additional data in read-write memory of said portable programmer;
    entering a command to cause said portable programmer to transmit said additional data and said data set to said register after coupling said portable programmer to said register; and
    storing said additional data and said data set in read-write memory of said register.

* * * * *